United States Patent
Suzuki

[11] Patent Number: 5,803,975
[45] Date of Patent: Sep. 8, 1998

[54] MICROWAVE PLASMA PROCESSING APPARATUS AND METHOD THEREFOR

[75] Inventor: Nobumasa Suzuki, Yokohama, Japan

[73] Assignee: Canon Kabushiki Kaisha, Japan

[21] Appl. No.: 806,070

[22] Filed: Feb. 25, 1997

[30] Foreign Application Priority Data

| Mar. 1, 1996 | [JP] | Japan | 8-044884 |
| Mar. 14, 1996 | [JP] | Japan | 8-057288 |

[51] Int. Cl.$^6$ ................................................. C23C 16/00
[52] U.S. Cl. .................... 118/723 MW; 118/723 ME; 118/723 MA; 118/723 MR; 156/345; 204/298.38; 438/726; 438/727; 438/728; 427/575
[58] Field of Search .......................... 118/723 R, 723 E, 118/723 MW, 723 ME, 723 MR, 723 MA; 156/345; 204/298.38; 438/726, 727, 728; 427/575; 422/186, 186.04, 186.05, 186.29, 906

[56] References Cited

U.S. PATENT DOCUMENTS

| 4,741,800 | 5/1988 | Yamazaki | 156/643 |
| 4,776,918 | 10/1988 | Otsubo et al. | 156/345 |
| 5,024,716 | 6/1991 | Sato | 156/345 |
| 5,134,965 | 8/1992 | Tokuda et al. | 118/723 |
| 5,359,177 | 10/1994 | Taki et al. | 219/121.43 |
| 5,487,875 | 1/1996 | Suzuki | 422/186.05 |
| 5,538,699 | 7/1996 | Suzuki | 422/186.29 |
| 5,646,489 | 7/1997 | Kakehi et al. | 315/111.21 |

FOREIGN PATENT DOCUMENTS 5-345982   12/1993   Japan .

Primary Examiner—Robert Kunemund
Assistant Examiner—Luz Alejandro
Attorney, Agent, or Firm—Fitzpatrick, Cella, Harper & Scinto

[57] ABSTRACT

For generating uniform high-density plasma over a large area with a low power thereby achieving high-quality plasma process at a high speed even at a low temperature, there is provided a microwave plasma processing apparatus comprising a plasma generation chamber having a periphery separated from the ambient air by a dielectric member, microwave introduction means utilizing an endless annular wave guide tube provided around the plasma generation chamber and provided with plural slots, a processing chamber connected to the plasma generation chamber, support means for a substrate to be processed provided in the processing chamber, gas introduction means for the plasma generation chamber and the processing chamber, and evacuation means for the plasma generation chamber and the processing chamber, wherein the circumferential length $L_g$ of the endless annular wave guide tube, the wavelength $\lambda_g$ of the microwave in the endless annular wave guide tube, the circumferential length $L_s$ of the dielectric member and the wavelength $\lambda_s$ of the surface wave propagating in the dielectric material substantially satisfy a relationship:

$$L_s/\lambda_s = (2n1)L_g/\lambda_g$$

wherein n is 0 or a natural number.

59 Claims, 9 Drawing Sheets

MICROWAVE PLASMA PROCESSING APPARATUS AND METHOD THEREFOR

BACKGROUND OF THE INVENTION

1. Field of the Invention

The present invention relates to a microwave plasma processing apparatus and a method therefor, and more particularly to a microwave plasma processing apparatus and a method therefor capable of generating highly dense plasma uniformly over a large area, allowing high-quality processing of a large-area substrate at a low temperature at a high speed.

2. Related Background Art

Among the plasma processing apparatuses utilizing microwaves as the exciting source for plasma generation, there are already known the CVD apparatus, the etching apparatus, the ashing apparatus, etc.

Film formation with microwave plasma CVD apparatus is conducted in the following manner. A gas is introduced in the plasma generation chamber and the film forming chamber (processing chamber) of the microwave plasma CVD apparatus, and a microwave energy is supplied to generate plasma in the plasma generation chamber, thereby exciting and decomposing the gas and depositing a film on a substrate positioned in the film forming chamber (processing chamber).

Etching of a substrate with such microwave a plasma etching apparatus is conducted in the following manner: an etchant gas is introduced in the processing chamber of the apparatus, and a microwave energy is supplied to excite and decompose the etchant gas and to generate plasma in the processing chamber, thereby etching the surface of a substrate provided in the processing chamber.

Such microwave plasma processing apparatus, utilizing microwave as the exciting source for the gas, can accelerate the electrons with an electric field of a high frequency, thereby efficiently ionizing and exciting the gas molecules. Consequently such apparatus has high efficiencies in the ionization, excitation and decomposition of the gas, thus providing advantages of forming highly dense plasma relatively easily and of achieving high-quality processing at a low temperature with a high speed. Also since microwaves can pass through a dielectric substance, the plasma processing apparatus can be constructed in an electrodeless discharge type, whereby the plasma processing can be achieved in a highly clean environment.

To attain a higher processing speed in such microwave plasma processing apparatus, an apparatus utilizing electron cyclotron resonance (ECR) has been commercialized. The ECR is a phenomenon in which, for a magnetic flux density of 87.5 mT, the electron cyclotron frequency in which the electrons revolve around the magnetic flux, coincides with the common microwave frequency 2.45 GHz whereby the electrons are accelerated by resonant absorption of the microwave thereby generating highly dense plasma. In such ECR plasma processing apparatus, there are known four representative configurations for the microwave introducing means and the magnetic field generating means.

More specifically, such configurations are (i) a configuration in which microwaves, transmitted through a wave guide tube, are introduced into a cylindrical plasma generation chamber through a transmissive window from a direction opposite to a substrate to be processed (hereinafter, simply referred to as "processed substrate") while a diverging magnetic field concentric with the central axis of the plasma generation chamber is introduced through an electromagnetic coil provided around the plasma generation chamber; (ii) a configuration in which microwaves, transmitted through a wave guide tube, are introduced into a bell-shaped plasma generation chamber through a transmissive window from a direction opposite to the processed substrate while a magnetic field concentric with the central axis of the plasma generation chamber is introduced through an electromagnetic coil provided around the plasma generation chamber; (iii) a configuration in which microwaves are introduced into the plasma generation chamber from the periphery thereof through a Rigitano coil, which is a kind of cylindrical slot antenna, while a magnetic field concentric with the central axis of the plasma generation chamber is introduced through an electromagnetic coil provided around the plasma generation chamber; and (iv) a configuration in which microwaves, transmitted through a wave guide tube, are introduced into a cylindrical plasma generation chamber through a flat plate-shaped slot antenna from a direction opposite to the processed substrate while a loop-shaped magnetic field parallel to the plane of the antenna is introduced by a permanent magnet provided behind the flat antenna.

In the field of such microwave plasma processing apparatus, there is recently proposed an apparatus utilizing an annular wave guide tube having plural slots on the internal lateral face thereof, for uniform and efficient introduction of the microwave, as disclosed in the U.S. Pat. No. 5,487,875. An example of such microwave processing apparatus is shown in FIG. 1, and the plasma generating mechanism of such apparatus is shown in a schematic cross-sectional view in FIG. 2. In these drawings there are shown a plasma generation chamber 501; a dielectric member 502 separating the plasma generation chamber 501 from the ambient air; a slotted endless annular wave guide tube 503 for introducing the microwave into the plasma generation chamber 501; plasma generating gas introduction means 504; a processing chamber 511 connected with the plasma generation chamber 501; a substrate 512 to be processed; a support member 513 for the processed substrate 512; a heater 514 for heating the processed substrate 512; process gas introduction means 515; a gas outlet 516; a block 521 for distributing the microwave to the right and to the left; a slot 522; microwave 523 introduced in the annular wave guide tube 503; microwave 524 propagating in the annular wave guide tube 503; leaking wave 525 of the microwave introduced through the slot 522 and the dielectric member 502 into the plasma generation chamber 501; surface wave 526 of the microwave transmitted by the slot 522 and propagating in the dielectric member 502; plasma 527 generated by the leaking wave; and plasma 528 generated by the surface wave.

The generation of plasma and the processing therewith are carried out in the following manner. The interiors of the plasma generation chamber 501 and the processing chamber 511 are evacuated by a vacuum system (not shown). Then plasma generating gas is introduced, by gas introduction means 504, into the plasma generation chamber 501 at a predetermined flow rate. Then a conductance value provided in the vacuum system (not shown) is so adjusted as to maintain the interior of the plasma generation chamber 501 at a predetermined pressure. A desired electric power is supplied from a microwave source (not shown), through the annular wave guide tube 503, into the plasma generation chamber 501. The microwave 523 introduced into the annular wave guide tube 503 is distributed to the left and to the right by the distributing block 521, and propagates with an in-tube wavelength longer than the wavelength in the free space. The leaking wave 525, introduced into the plasma generation chamber 501 through the slots 522 which are provided at an interval of ½ or ¼ of the guide wavelength of such propagating microwave 524 and also through the dielectric member 502, generates plasma 527 in the vicinity of the slot 522. Also the microwave made incident with an angle equal to or larger than the Brewster's angle to a normal line to the surface of the dielectric member 502 is totally reflected by the first surface of the dielectric member 502 and propagates inside the dielectric member 502 as a surface wave 526. Also the leaking electric field of the surface wave 526 generates plasma 528. Processing gas, introduced into the processing chamber 511 through the processing gas introduction pipe 515, is excited by the generated dense plasma, and thus excited gas processes the surface of the processed substrate 512 placed on the support member 513. The processing gas may also be introduced from the plasma generating gas introduction means 504.

FIGS. 3 and 4 schematically illustrate the relationship between the annular wave guide tube 503 and the plasma generation chamber 501. In FIGS. 3 and 4, components the same as those in FIGS. 1 and 2 are represented by the same numbers. FIGS. 3 and 4 are respectively a schematic perspective view and a schematic cross-sectional view, showing the principal parts only.

Such microwave plasma processing apparatus is capable, with a microwave power of 1 kW or higher, of generating low-temperature high-density plasma of an electronic temperature of 3 eV or less and an electron density of $10^{12}/cm^3$ or higher uniformly in a space of a large diameter of 300 mm of higher, thereby causing sufficient reaction of the gas and supplying the gas in the activated state to the substrate, whereby high-quality processing can be achieved with a high speed, even at a low temperature.

However, in consideration of the low-temperature processing with the microwave plasma processing apparatus capable of generating low-temperature high-density plasma as shown in FIGS. 1 and 2, there is desired an apparatus and a method therefor, capable of generating plasma of a higher density in a larger diameter space with a lower power, in order to achieve processing such as film forming, etching or ashing with higher quality at a lower temperature at a higher speed.

SUMMARY OF THE INVENTION

In consideration of the foregoing, an object of the present invention is to provide a microwave plasma processing apparatus and a method therefor, capable of generating uniform high-density plasma of a large area with a low power, thereby enabling high-quality processing at a high speed, even at a low temperature.

Another object of the present invention is to provide a microwave plasma processing apparatus comprising a plasma generation chamber whose periphery is separated from the ambient air by a dielectric member, microwave introduction means utilizing an endless annular wave guide tube provided around the plasma generation chamber and provided with plural slots, a processing chamber connected to the plasma generation chamber, support means for a substrate to be processed, provided in the processing chamber, gas introduction means for the plasma generation chamber and the processing chamber, and evacuation means for the plasma generation chamber and the processing chamber, wherein the circumferential length $L_g$ of the endless annular wave guide tube, the wavelength $\lambda_g$ of the microwave in the endless annular wave guide tube, the circumferential length $L_s$ of the dielectric member and the wavelength $\lambda_s$ of the surface wave propagating in the dielectric member substantially satisfy a relationship:

$$L_s/\lambda_s=(2n+1)L_g/\lambda_g$$

wherein n is 0 or a natural number.

Still another object of the present invention is to provide a microwave plasma processing apparatus comprising a plasma generation chamber of which periphery is separated from the ambient air by a dielectric member, microwave introduction means utilizing a cylindrical endless annular wave guide tube provided around the plasma generation chamber and provided with plural slots, a processing chamber connected to the plasma generation chamber, support means for a substrate to be processed, provided in the processing chamber, gas introduction means for the plasma generation chamber and the processing chamber, and evacuation means for the plasma generation chamber and the processing chamber, wherein the central radius $R_g$ of the endless annular wave guide tube, the wavelength $\lambda_g$ of the microwave in the endless annular wave guide tube, the central radius $R_s$ of the dielectric member and the wavelength $\lambda_s$ of the surface wave propagating in the dielectric member substantially satisfy a relationship:

$$R_s/\lambda_s=(2n+1)R_g/\lambda_g$$

wherein n is 0 or a natural number.

Still another object of the present invention is to provide a microwave plasma processing apparatus comprising a plasma generation chamber separated from the ambient air by a first dielectric material, a processing chamber connected to the plasma generation chamber, means for supporting a substrate to be processed, to be placed in the processing chamber, microwave introduction means utilizing an endless annular wave guide tube provided around the plasma generation chamber and provided with plural slots, means for introducing gas for the plasma generation chamber and the processing chamber, and evacuation means for the plasma generation chamber and the processing chamber, wherein the interior of the annular wave guide tube is filled with a second dielectric material which is the same as or different from the first dielectric material.

Still another object of the present invention is to provide a microwave plasma processing method utilizing a microwave plasma processing apparatus comprising a plasma generation chamber of which periphery is separated from the ambient air by a dielectric member, microwave introduction means utilizing an endless annular wave guide tube provided around the plasma generation chamber and provided with plural slots, a processing chamber connected to the plasma generation chamber, support means for a substrate to be processed, provided in the processing chamber, gas introduction means for the plasma generation chamber and the processing chamber, and evacuation means for the plasma generation chamber and the processing chamber, and selecting the circumferential length $L_g$ of the endless annular wave guide tube, the wavelength $\lambda_g$ of the microwave in the endless annular wave guide tube, the circumferential length $L_s$ of the dielectric member and the wavelength $\lambda_s$ of the surface wave propagating in the dielectric member so as to substantially satisfy a relationship:

$$L_s/\lambda_s=(2n+1)L_g/\lambda_g$$

wherein n is 0 or a natural number, thereby effecting a plasma process on the substrate.

Still another object of the present invention is to provide a microwave plasma processing method utilizing a microwave plasma processing apparatus comprising a plasma generation chamber of whose periphery is separated from the ambient air by a dielectric member, microwave introduction means utilizing a cylindrical endless annular wave guide tube provided around the plasma generation chamber and provided with plural slots, a processing chamber connected to the plasma generation chamber, support means for a substrate to be processed, provided in the processing chamber, gas introduction means for the plasma generation chamber and the processing chamber, and evacuation means for the plasma generation chamber and the processing chamber, and selecting the central radius $R_g$ of the endless annular wave guide tube, the wavelength $\lambda_g$ of the microwave in the endless annular wave guide tube, the central radius $R_s$ of the dielectric member and the wavelength $\lambda_s$ of the surface wave propagating in the dielectric member so as to substantially satisfy a relationship:

$$R_s/\lambda_s = (2n+1)R_g/\lambda_g$$

wherein n is 0 or a natural number, thereby effecting a plasma process.

Still another object of the present invention is to provide a microwave plasma processing method by placing a substrate in a microwave plasma processing apparatus comprising a plasma generation chamber separated from the ambient air by a first dielectric material, a processing chamber connected to the plasma generation chamber, means for supporting a substrate to be processed, to be placed in the processing chamber, microwave introduction means utilizing an endless annular wave guide tube provided around the plasma generation chamber and provided with plural slots, means for introducing gas for the plasma generation chamber and the processing chamber, and evacuation means for the plasma generation chamber and the processing chamber, wherein the interior of the annular wave guide tube is filled with a second dielectric material which is the same as or different from the first dielectric material, thereby effecting a plasma processing.

DETAILED DESCRIPTION OF THE PREFERRED EMBODIMENTS

Now the present invention will be clarified in detail by preferred embodiments, with reference to the attached drawings.

Figure 5:
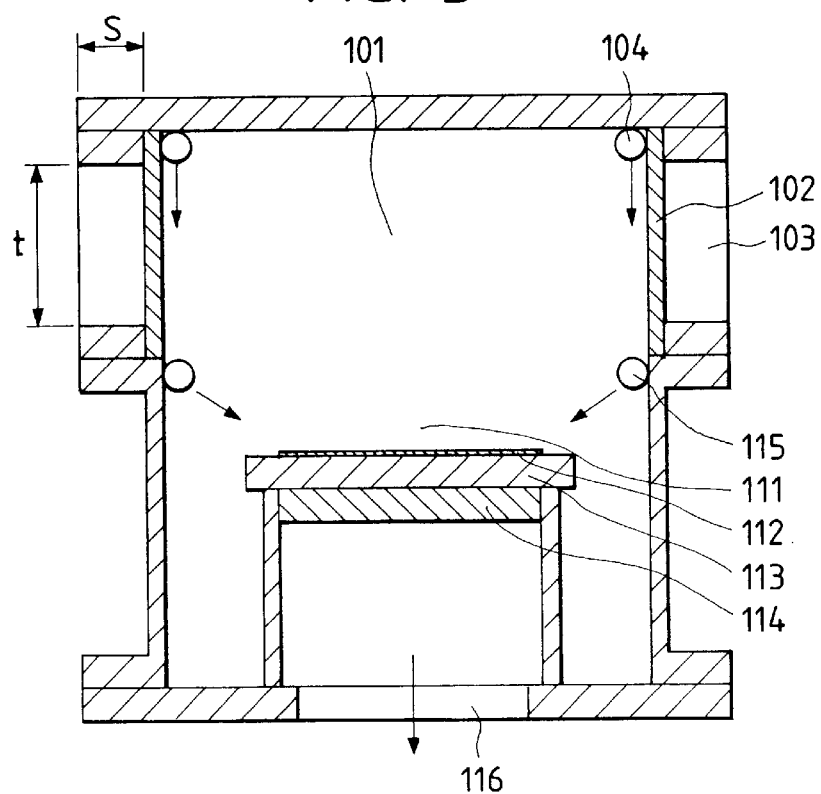
FIG. 5 is a schematic cross-sectional view of a plasma processing apparatus.
Figure 6:
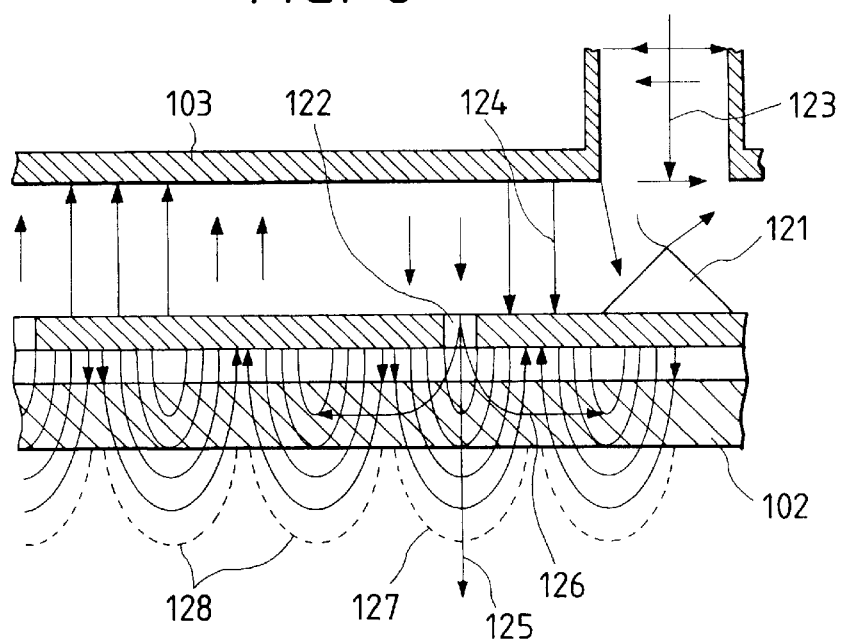
FIG. 6 is a schematic cross-sectional view for explaining an example of the plasma generating mechanism.

An example of the microwave plasma processing apparatus of the present invention and the plasma generating mechanism thereof are respectively shown in FIGS. 5 and 6, wherein shown are a plasma generation chamber 101; a dielectric member 102 for separating the plasma generating chamber 101 from the ambient air; a slotted endless annular wave guide tube 103 for introducing the microwave into the plasma generation chamber 101; plasma generating gas introduction means 104; a processing chamber 111 connected to the plasma generation chamber; a substrate 112 to be processed; a support member 113 for the processed substrate 112; a heater 114 for heating the processed substrate 112; processing gas introduction means 115; an evacuation outlet 116; a block 121 for distributing the microwave to the left and to the right; a slot 122; microwave 123 introduced into the annular wave guide tube 103; microwave 124 propagating in the annular wave guide tube 103; leaking wave 125 of the microwave introduced into the plasma generation chamber 101 through the slot 122 and the dielectric member 102; surface wave 126 of the microwave transmitted through the slot 122 and propagating in the dielectric member 102; plasma 127 generated by the leaking wave; and plasma 128 generated by the surface wave.

The generation of plasma and the processing therewith are carried out in the following manner. The interior of the plasma generation chamber 101 and the processing chamber 111 is evacuated by a vacuum system (not shown). Then plasma generating gas is introduced, by gas introduction means 104, into the plasma generation chamber 101 at a predetermined flow rate. Then a conductance valve provided in the vacuum system (not shown) is so adjusted as to maintain the interior of the plasma generation chamber 101 at a predetermined pressure. A desired electric power is supplied from a microwave source (not shown), through the annular wave guide tube 103, into the plasma generation chamber 101, thereby generating plasma therein. The microwave 123 introduced into the annular wave guide tube 103 is distributed to the left and to the right by the distributing block 121, and propagates in the annular wave guide tube 103. The leaking wave 125, introduced into the plasma generation chamber 101 through the slots 122 which are provided at an interval of ½ or ¼ of the guide wavelength of such propagating microwave 124 and also through the dielectric member 102, generates plasma 127 in the vicinity of the slot 122. Also the microwave entering with an angle equal to or larger than the Brewster's angle to a normal line to the surface of the dielectric member 102 is totally reflected by the surface of the dielectric member 102 and propagates inside the dielectric member 102 as a surface wave 126. Also the leaking electric field of the surface wave 126 generates plasma 128.

Figure 1:
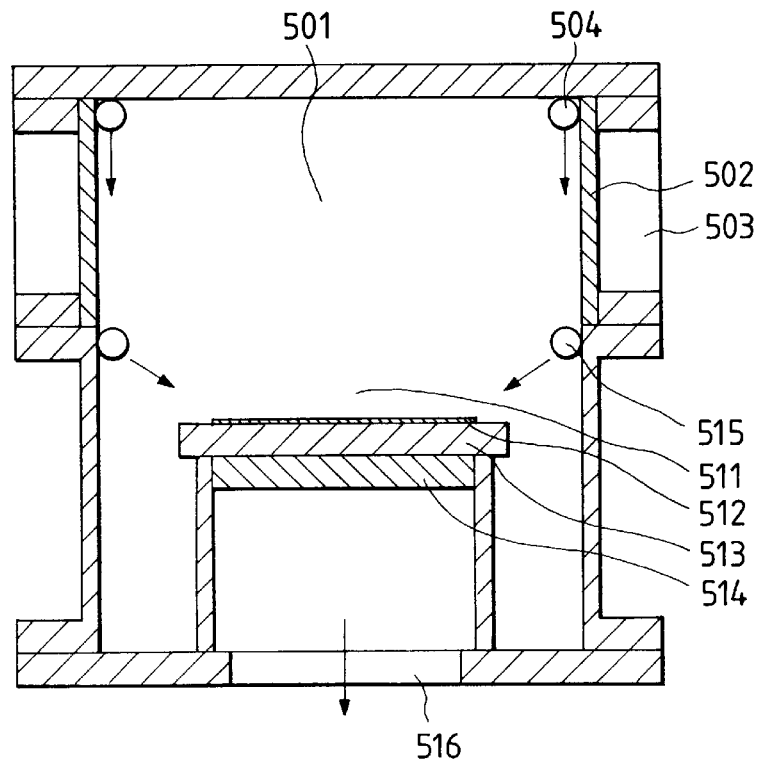
FIG. 1 is a schematic cross-sectional view of a plasma processing apparatus.
Figure 2:
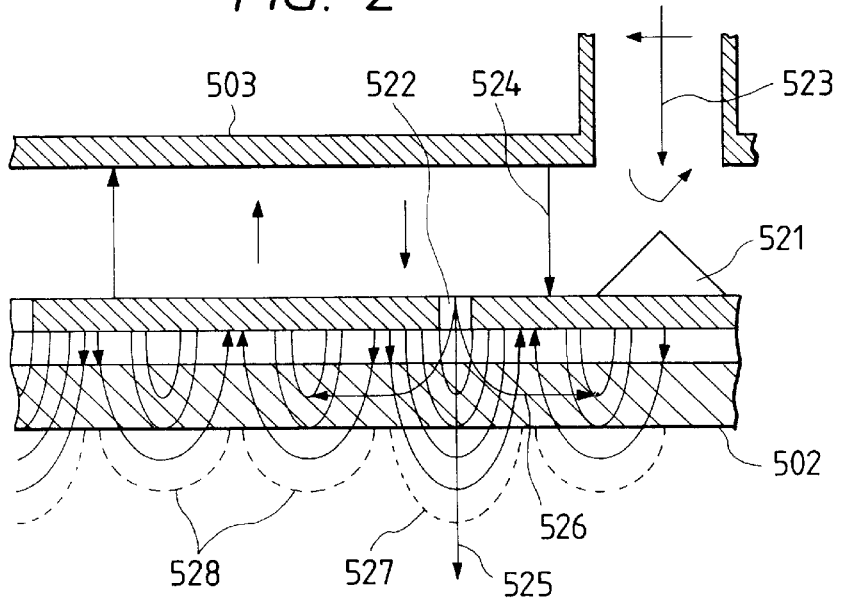
FIG. 2 is a schematic cross-sectional view for explaining an example of the plasma generating mechanism.
Figure 3:
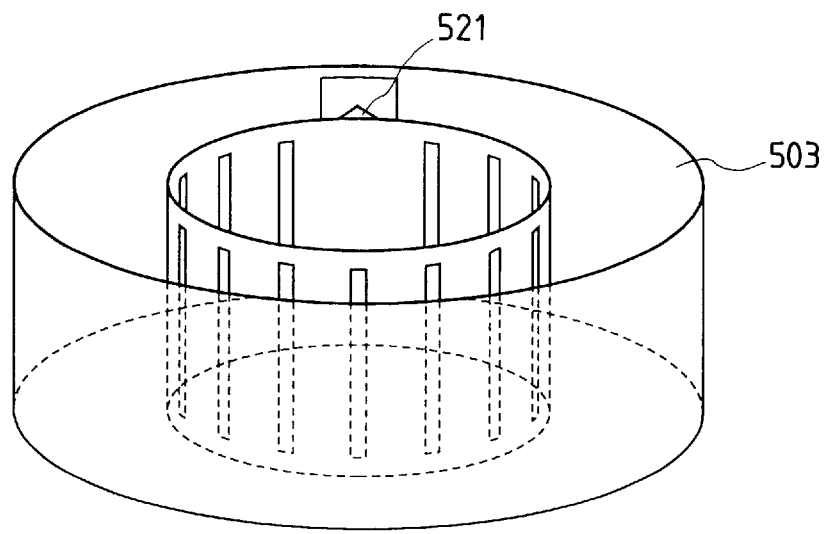
FIG. 3 is a schematic perspective view of an example of the wave guide tube.
Figure 4:
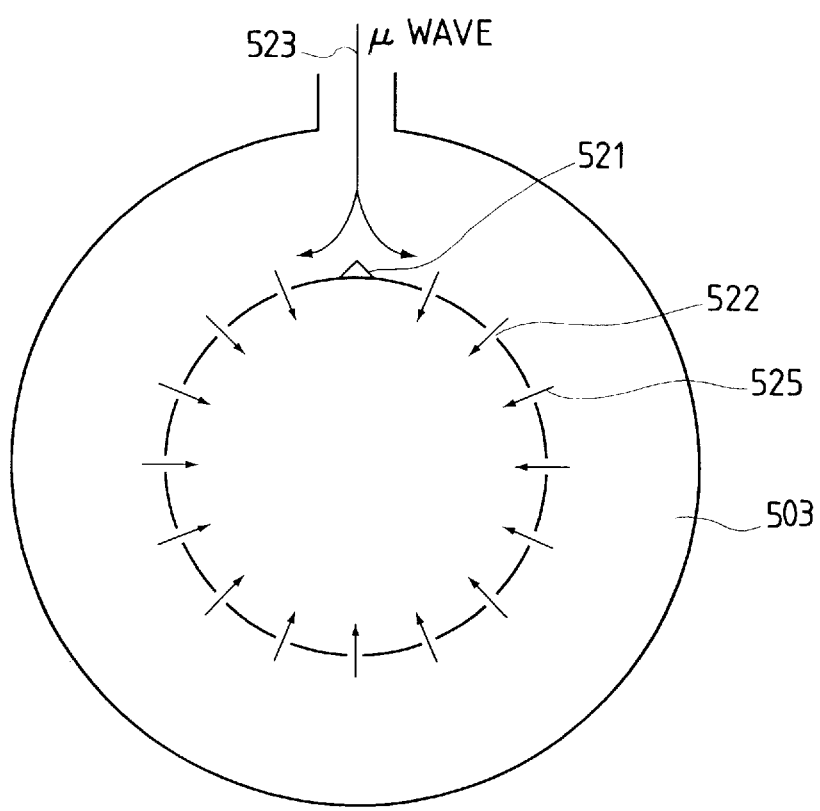
FIG. 4 is a schematic plan view thereof.

In the apparatus shown in FIGS. 1 and 2, as the surface wave 526 is not excited in the course of propagation, the generated plasma 528 becomes less dense than the plasma 527 generated by the leaking wave 525. However, in case of the apparatus of the present invention shown in FIGS. 5 and 6, the in-tube wavelength and the circumferential length of the annular wave guide tube 103 are so optimized that the slots 122 are positioned at an interval of ½ of the surface wave 126, whereby the surface wave 126 is amplified in the course of propagation by interference with the leaking wave 125 from other slots to generate denser and more uniform plasma 128 in comparison with the aforementioned case. Processing gas, introduced into the processing chamber 111 through the processing gas introduction pipe 115, is excited by the generated high-density plasma, and thus excited gas processes the surface of the substrate 112 placed on the support member 113. The processing gas may also be introduced from the plasma generating gas introduction means 104.

In the above-explained microwave plasma processing apparatus of the present invention, the circumferential length $L_g$ of the annular wave guide tube 103, the wavelength $\lambda_g$ of the microwave 124 therein, the circumferential length $L_s$ of the dielectric member 102 and the wavelength $\lambda_s$ of the surface wave propagating therein are so selected as to substantially satisfy a relationship:

$$L_s/\lambda_s=(2n+1)L_g/\lambda_g$$

wherein n is 0 or a natural number, whereby the surface wave of the microwave propagating in the dielectric member is periodically excited to realize stronger and more efficient propagation, thus generating uniform high-density plasma over a large area with a low electric power. The above-mentioned relationship is preferably satisfied within a range of ±10%.

In case the annular wave guide tube 103 has a cylindrical annular shape, the central radius $R_g$ of the annular wave guide tube, the wavelength $\lambda_g$ of the microwave in the endless annular wave guide tube, the central radius $R_s$ of the dielectric material and the wavelength $\lambda_s$ of the surface wave propagating in the dielectric material are so selected as to substantially satisfy a relationship:

$$R_s/\lambda_s=(2n+1)R_g/\lambda_g$$

wherein n is 0 or a natural number, whereby the surface wave of the microwave propagating in the dielectric material is periodically excited to realize stronger and more efficient propagation, thus generating uniform high-density plasma over a large area with a low electric power. The above-mentioned relationship is preferably satisfied within a range of ±10%.

Figure 7:
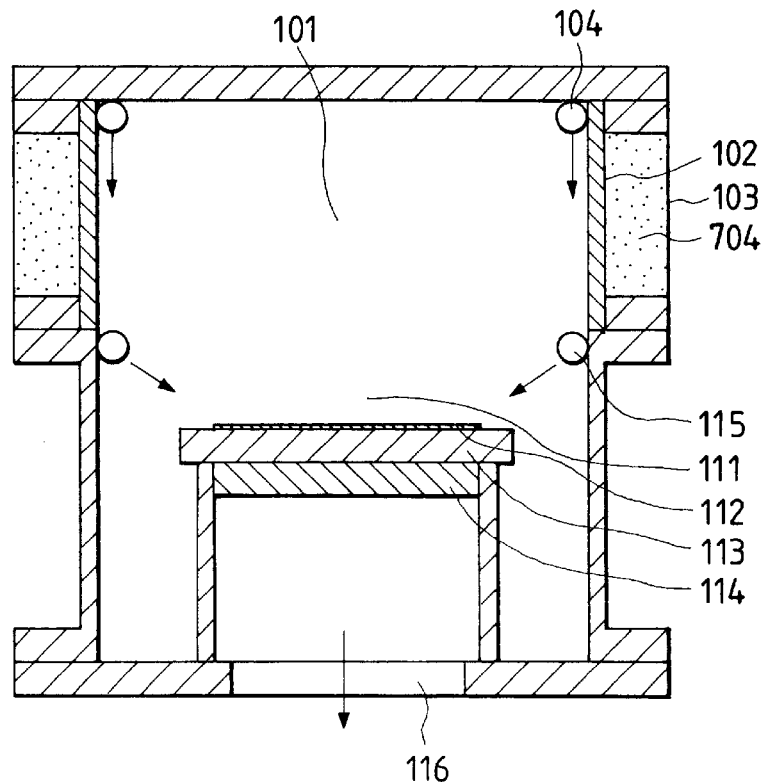
FIG. 7 is a schematic cross-sectional view for explaining an example of the plasma processing apparatus.
Figure 8:
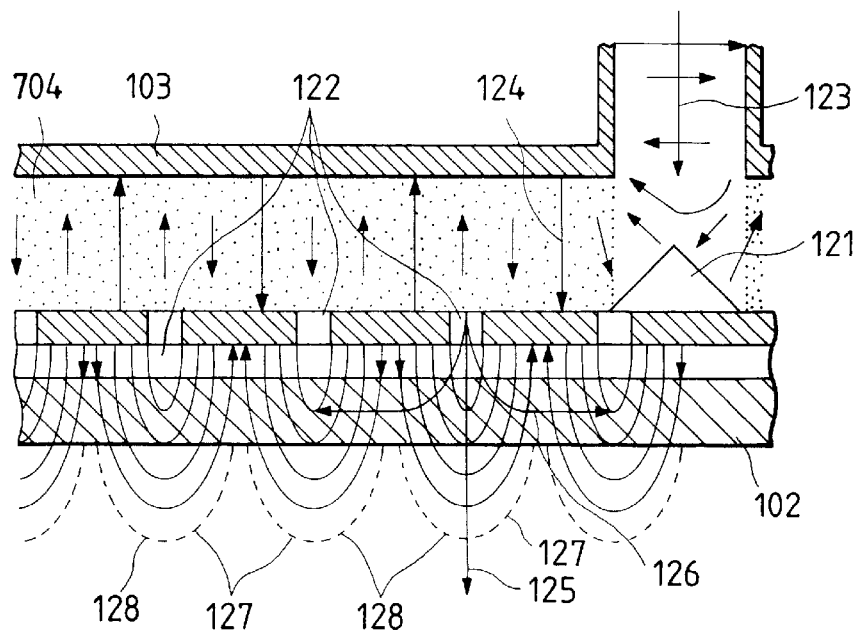
FIG. 8 is a schematic cross-sectional view for explaining an example of the plasma generating mechanism.

Another preferred embodiment of the microwave plasma processing apparatus of the present invention and the plasma generating mechanism thereof are respectively illustrated in FIGS. 7 and 8, in which components the same as those shown in FIGS. 5 and 6 are represented by the same numbers and will not be explained further.

The apparatus shown in FIGS. 7 and 8 is different from the foregoing one in that the annular wave guide tube 103 is filled with a second dielectric material, which is in addition to the dielectric material (first dielectric material) separating the plasma generation chamber 101 from the ambient air.

In the apparatus shown in FIG. 1, as the surface wave 526 is not excited in the course of propagation, the generated plasma 528 becomes less dense than the plasma 527 generated by the leaking wave 525. However, in the apparatus shown in FIG. 7, the dielectric constant of the second dielectric material 704 is so optimized that the slots 122 are positioned at an interval of ½ of the surface wave 126, whereby the surface wave 126 is amplified in the course of propagation by interference with the leaking wave 125 from other slots to generate denser and more uniform plasma 128 in comparison with the configuration shown in FIG. 1. Processing gas, introduced into the processing chamber 111 through the processing gas introduction pipe 115, is excited by the generated high-density plasma, and thus excited gas processes the surface of the processed substrate 112 placed on the support member 113. The processing gas may also be introduced from the plasma generating gas introduction input 104.

A desired electric power is supplied from a microwave source (not shown), through the annular wave guide tube 103 filled with the second dielectric material 704 and through the first dielectric material 102, into the plasma generation chamber 101, thereby generating plasma therein. The microwave 123 introduced into the annular wave guide tube 103 is distributed to the left and to the right by the distributing block 121, and propagates in the second dielectric material 704 with a shorter wavelength than in the free space. The leaking wave 125, introduced into the plasma generation chamber 101 through the slots 122 which are provided at an interval of ½ or ¼ of the guide wavelength and also through the first dielectric material 102, generates plasma 127 in the vicinity of the slot 122. Also the microwave entering with an angle equal to or larger than the Brewster's angle to a normal line to the surface of the first dielectric material 102 is totally reflected by the surface thereof and propagates inside the first dielectric material 102 as a surface wave 126. Also the leaking electric field of the surface wave 126 generates plasma 128.

As explained in the foregoing, the interior of the annular wave guide tube is filled with a second dielectric material which is the same as or different from the first dielectric material for separating the plasma generation chamber from the ambient air, and the ratio of the dielectric constants of the first and second dielectric materials is approximately equal to the reciprocal of the square of the ratio of the circumferential lengths of the first and second dielectric materials, whereby the surface wave of the microwave propagating in the first dielectric material is periodically excited to realize stronger and more efficient propagation, thus generating uniform high-density plasma over a large area with a low electric power.

The frequency of the microwave, employed in the microwave plasma processing apparatus and the method therefor of the present invention, can be suitably selected within a range from 0.8 to 20 GHz.

Also the shape of the wave guide tube employed in the microwave plasma processing apparatus of the present invention may be cylindrical, or another shape such as a disk-shape or a polygonal shape according to the shape of the plasma generation chamber.

The dielectric material, employed in the microwave plasma processing apparatus and the method therefor of the present invention, can be, for example, a film or a sheet of quartz or $SiO_2$-based glass, an inorganic material such as $Si_3N_4$, NaCl, LiF, $CaF_2$, $BaF_2$, $Al_2O_3$, AlN or MgO, or an organic material such as polyethylene, polyester, polycarbonate, cellulose acetate, polypropylene, polyvinyl chloride, polyvinylidene chloride, polystyrene, polyamide or polyimide.

In the microwave plasma processing apparatus and the method therefor of the present invention, magnetic field generation means may be employed to achieve processing at a lower pressure. Such magnetic field can be, for example, a miller magnetic field, but there is most preferably employed a cusp magnetic field, having a nodal plane in a plane containing the centers of the plural slots of the slotted annular wave guide tube, showing magnetic fluxes substantially perpendicular to the substrate support member and having a magnetic flux density in the vicinity of the slots larger than that in the vicinity of the substrate. The magnetic field generation means can be composed of a coil or a permanent magnet. In case of a coil, there may also be employed cooling means such as a water-cooling or air-cooling mechanism, for avoiding overheating. By the use of such magnetic field generation means, the magnetic field in the vicinity of the slots is preferably controlled at a magnetic flux density of about $3.57 \times 10^{-11}$ (T/Hz) times of the microwave frequency. The above-mentioned control is desirably achieved within a range of ±10% of the above-mentioned figure.

For achieving higher quality in the processing, the surface of the processed substrate may be irradiated with optical energy such as ultraviolet energy. For this purpose there can be employed any light source emitting the light absorbed by the processed substrate or the gas deposited thereon, such as an excimer laser, an excimer lamp, a rare gas resonance line lamp or a low-pressure mercury lamp.

The pressure in the plasma generation chamber and in the processing chamber in the microwave plasma processing method of the present invention is preferably selected within a range, generally from 0.1 Torr to 20 Torr, particularly from 1 mTorr to 100 mTorr in case of film formation, and from 100 mTorr to 10 Torr in case of ashing.

The microwave plasma processing method of the present invention allows efficient formation of various deposited films by suitable selection of the used gas, for example an insulation film such as of $Si_3N_4$, $SiO_2$, $Ta_2O_5$, $TiO_2$, TiN, $Al_2O_3$, AlN or $MgF_2$, a semiconductor film such as of a-Si (amorphous Si), poly-Si, SiC or GaAs, or a metal film such as of Al, W, Mo, Ti or Ta.

The substrate to be processed by the plasma processing method of the present invention can be semiconductive, electroconductive or electroinsulating. The method is also applicable to plastic materials of low thermal resistance.

Examples of the electroconductive substrate include metals such as Fe, Ni, Cr, Al, Mo, Au, Nb, Ta, V, Ti, Pt or Pb, and alloys thereof such as brass or stainless steel.

Examples of the insulating substrate include a film or a sheet of quartz or $SiO_2$-based glass, an inorganic material such as $Si_3N_4$, NaCl, KCl, LiF, $CaF_2$, $BaF_2$, $Al_2O_3$, AlN or MgO, and an organic material such as polyethylene, polyester, polycarbonate, cellulose acetate, polypropylene, polyvinyl chloride, polyvinylidene chloride, polystyrene, polyamide or polyimide.

The film forming gas (processing gas) already known gas. The gas which can be easily decomposed by the plasma to be deposited alone is desirably introduced into the film forming chamber (processing chamber) through processing gas introduction means therein, for the purpose of attaining the stoichiometric composition and avoiding film deposition in the plasma generation chamber. On the other hand, a gas which cannot be easily decomposed by the plasma to be deposited alone is desirably introduced into the plasma generation chamber through plasma generating gas introduction means thereof.

In case of forming a film of a Si-containing semiconductor such as a-Si, poly-Si or SiC, the Si-containing raw material to be introduced through the processing gas introduction means can be a substance in the gaseous state at normal temperature and normal pressure or an easily gasifiable substance, for example an inorganic silane such as $SiH_4$ or $Si_2H_6$, an organic silane such as tetraethylsilane (TES), tetramethylsilane (TMS) or dimethylsilane (DMS), or a halosilane such as $SiF_4$, $Si_2F_6$, $SiHF_3$, $SiH_2F_2$, $SiCl_4$, $Si_2Cl_6$, $SiHCl_3$, $SiH_2Cl_2$, $SiH_3Cl$ or $SiCl_2F_2$. In such case, the plasma generating gas to be introduced through the plasma generating gas introduction means can be, for example, $H_2$, He, Ne, Ar, Kr, Xe or Rn.

In case of forming a film of a Si-compound such as $Si_3N_4$ or $SiO_2$, the Si-containing raw material to be introduced through the processing gas introduction means can be a substance in the gaseous state at normal temperature and normal pressure or an easily gasifiable substance, for example an inorganic silane such as $SiH_4$ or $Si_2H_6$, an organic silane such as tetraethoxysilane (TEOS), tetramethoxysilane (TMOS) or octamethylcyclotetrasilane (OMCTS), or a halosilane such as $SiF_4$, $Si_2F_6$, $SiHF_3$, $SiH_2F_2$, $SiCl_4$, $Si_2Cl_6$, $SiHCl_3$, $SiH_2Cl_2$, $SiH_3Cl$ or $SiCl_2F_2$. In such case, the raw material to be introduced through the plasma generating gas introduction means can be, for example, $N_2$, $NH_3$, $N_2H_4$, hexamethyldisilazane (HMDS), $O_2$, $O_3$, $H_2O$, NO, $N_2O$ or $NO_2$.

In case of forming a metal film such as Al, W, Mo, Ti or Ta, the metal-containing raw material to be introduced through the processing gas introduction means can be an organometallic compound such as trimethyl aluminum (TMAl), triethyl aluminum (TEAl), triisobutyl aluminum (TIBAl), dimethylaluminum hydride (DMAlH), tungsten carbonyl ($W(CO)_6$), molybdenum carbonyl ($Mo(CO)_6$), trimethyl gallium (TMGa) or triethyl gallium (TEGa), or a metal halide such as $AlCl_3$, $WF_6$, $TiCl_3$ or $TaCl_5$. In such case, the plasma generating gas to be introduced through the plasma generating gas introduction means can be, for example, $H_2$, He, Ne, Ar, Kr, Xe or Rn.

In case of forming a metal compound film such as $Al_2O_3$, AlN, $Ta_2O_5$, $TiO_2$, TiN or $WO_3$, the metal-containing raw material to be introduced through the processing gas introduction means can be an organometallic compound such as trimethyl aluminum (TMAl), triethyl aluminum (TEAl), triisobutyl aluminum (TIBAl), dimethylaluminum hydride (DMAlH), tungsten carbonyl ($W(CO)_6$), molybdenum carbonyl ($Mo(CO)_6$), trimethyl gallium (TMGa) or triethyl gallium (TEGa), or a metal halide such as $AlCl_3$, $WF_6$, $TiCl_3$ or $TaCl_5$. In such case, the raw material gas to be introduced through the plasma generating gas introduction means can be, for example, $O_2$, $O_3$, $H_2O$, NO, $N_2O$, $NO_2$, $N_2$, $NH_3$, $N_2H_4$ or hexamethyldisilazane (HMDS).

Furthermore, the microwave plasma processing apparatus and the method therefor of the present invention can also applied to surface modification by suitable selection of the gasses used, for example oxidation, nitriding or doping with B, As, P, or the like of a substrate or a surface layer of Si, Al, Ti, Zn or Ta.

Furthermore, the film forming technology of the present invention is also applicable to a cleaning method, including the cleaning of an oxide, an organic substance or a heavy metal.

In case of surface oxidation of the processed substrate, the oxidizing gas to be introduced through the plasma generating gas introduction means can be, for example, $O_2$, $O_3$, $H_2O$, NO, $N_2O$ or $NO_2$. Also in case of surface nitriding of the substrate, the nitriding gas to be introduced through the plasma generating gas introduction means can be, for example, $N_2$, $NH_3$, $N_2H_4$ or hexamethyldisilazane (HMDS). In such case, because the film formation is not conducted, processing gas is not introduced through the processing gas introduction means, or the same gas as that introduced through the plasma generating gas introduction means is also introduced through the processing gas introduction means.

In case of cleaning an organic substance on the surface of the processed substrate, the cleaning gas to be introduced through the plasma generating gas introduction means can be, for example, $O_2$, $O_3$, $H_2O$, NO, $N_2O$ or $NO_2$. Also in case of cleaning an inorganic substance on the surface of the substrate, the cleaning gas to be introduced through the plasma generating gas introduction means can be, for example, $F_2$, $CF_4$, $CH_2F_2$, $C_2F_6$, $CF_2Cl_2$, $SF_6$ or $NF_3$. Also in such case, because the film formation is not conducted, processing gas is not introduced through the processing gas introduction means, or the same gas as that introduced through the plasma generating gas introduction means is also introduced through the processing gas introduction means.

The present invention will be further clarified by specific embodiments, but the present invention is not limited to such embodiments and is subject to various modifications and combinations within the scope of the present invention.

[Embodiment 1]

The present embodiment will be explained with reference to a microwave plasma processing apparatus in FIGS. 5 and 6, constituting an embodiment of the present invention.

The dielectric material 102 is composed of quartz of a dielectric constant of 3.8 and has a central diameter of 299 mm. The annular wave guide tube 103 has cross-sectional dimensions of s=27 mm and t=75 mm in FIG. 5, and a central diameter of 335 mm. The annular wave guide tube 103 is composed of stainless steel for maintaining the mechanical strength, provided on the inner wall surface thereof with two-layered platings with copper and then with silver, in order to reduce propagation loss of the microwave. The annular wave guide tube 103 is provided with slots 122 for introducing the microwave into the plasma generation chamber 101. The slots are of a rectangular shape with a length of 53 mm and a width of 3 mm, and are provided at an interval of ¼ of the wavelength of the microwave 124 in the annular wave guide tube 103. The wavelength $\lambda_g$ in the annular wave guide tube, being dependent on the frequency of the microwave used and the cross-sectional dimension of the wave guide tube, is about 210 mm in case of the microwave of a frequency of 2.45 GHz and the wave guide tube of the above-mentioned dimension. In such case, the wavelength $\lambda_s$ of the surface wave propagating in the dielectric material is 63 mm. The annular wave guide tube 103 of the present embodiment is provided with 20 slots formed at an interval of about 52.5 mm. To the annular wave guide tube 103, there are connected, in succession, a 4E tuner, a directional coupler, an isolator and a 2.45 GHz microwave source (not shown).

The generation of plasma and the processing therewith in the apparatus of the present embodiment are carried out in the following manner. The interior of the plasma generation chamber 101 and the processing chamber 111 is evacuated by a vacuum system (not shown). Then a plasma generating gas is introduced, by gas introduction means 104, into the plasma generation chamber 101 at a predetermined flow rate. Then a conductance valve (not shown) provided in the vacuum system (not shown) is so adjusted as to maintain the interior of the plasma generation chamber 101 and the processing chamber 111 at a predetermined pressure. A desired electric power is supplied from a microwave source (not shown), through the annular wave guide tube 103 and the dielectric material 102, into the plasma generation chamber 101, thereby generating plasma in the plasma generation chamber 101. A processing gas, introduced into the processing chamber 111 through the processing gas introduction means 115, is excited by the generated high-density plasma, and thus excited gas processes the surface of the substrate 112 placed on the support member 113. The processing gas may also be introduced from the plasma generating gas introduction means 104.

In the microwave plasma processing apparatus of the present embodiment shown in FIGS. 5 and 6, plasma was generated under the conditions of an Ar flow rate of 500 sccm, a pressure of 10 mTorr and a microwave power of 3.0 kW, and the plasma obtained was measured by a single probe method in the following manner. The voltage applied to the probe was varied in a range of −50 V to +50 V, and the current obtained in the probe was measured with an I–V meter and the electron density, the electron temperature and the plasma potential were calculated, according to the method of Langmuir et al., from the obtained I–V curve. The obtained electron density was $3.3 \times 10^{12}/cm^3 \pm 4.1\%$ (within a $\phi$200 plane), indicating the formation of uniform high-density plasma.

[Embodiment 2]

There was prepared the same plasma processing apparatus as that of Embodiment 1 except that the center of the plasma generation chamber and the substrate is larger by 100 mm as compared with the apparatus of Embodiment 1. In the apparatus (distant type plasma processing apparatus) of the present embodiment, the substrate support means is so provided that the processed substrate is positioned at a position distant from the plasma generation area. "The position distant from the plasma generation area" means a position where the plasma density is preferably ⅒ or less of that at the densest part. In the apparatus of the present embodiment, the generation of plasma and the processing therewith can be conducted in a similar manner as in the Embodiment 1.

[Embodiment 3]

Figure 9:
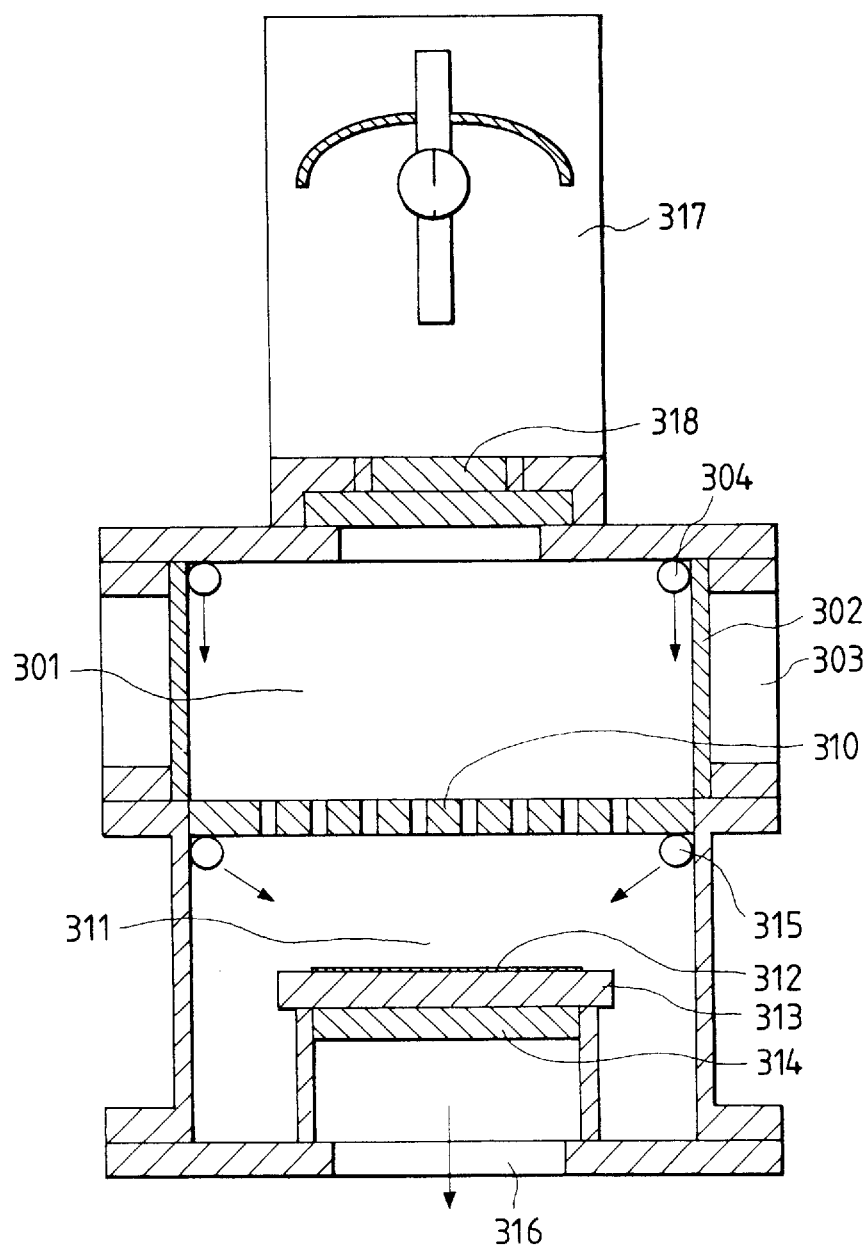
FIGS. 9, 10, 11, 12 and 13 are schematic cross-sectional views for explaining examples of the plasma processing apparatus.

FIG. 9 shows a photo-assisted microwave plasma processing apparatus constituting an embodiment of the present invention, wherein shown are a plasma generation chamber 301; a quartz tube (dielectric material) 302 for separating the plasma generation chamber 301 from the ambient air; a slotted endless annular wave guide tube 303 for introducing the microwave into the plasma generation chamber 301; plasma generating gas introduction means 304; a porous transparent diffusion plate 310; a processing chamber 311 connected to the plasma generation chamber; a processed substrate 312; a support member 313 for the processed substrate 312; a heater 314 for heating the processed substrate 312; processing gas introduction means 315; an evacuation outlet 316; illumination means 317 for irradiating the surface of the processed substrate 312 at least with ultraviolet light; and a light introducing window 318 for introducing the visible/ultraviolet light from the illumination means 317 into the processing chamber 311 through the plasma generation chamber 301.

The generation of plasma and the processing therewith are carried out in the following manner. The interior of the plasma generation chamber 301 and the processing chamber 311 is evacuated by a vacuum system (not shown). Then the visible/ultraviolet light from the illumination means 317 is directed to the surface of the processed substrate 312 through the light introducing window 318, and the processed substrate 312 is maintained at a desired temperature. Also a plasma generating gas is introduced, by gas introduction means 304, into the plasma generation chamber 301 at a predetermined flow rate. Then a conductance valve (not shown) provided in the vacuum system (not shown) is so adjusted as to maintain the interior of the plasma generation chamber 301 at a predetermined pressure. A desired electric power is supplied from a microwave source (not shown), through the annular wave guide tube 303 into the plasma generation chamber 301, thereby generating plasma therein. A processing gas, introduced into the processing chamber 311 through the processing gas introduction means 315, is excited by the generated high-density plasma, and thus excited gas processes the surface of the substrate 312 placed on the support member 313. Processing of higher quality is rendered possible, as the surface of the substrate is activated by the ultraviolet light. The processing gas may also be introduced from the plasma generating gas introduction means 304, according to the purpose.

The illumination means 317 may utilize any light source emitting light of a wavelength absorbable by the surface of the substrate, or a gas or a precursor deposited on the substrate surface, such as a low-pressure mercury lamp, a xenon-mercury lamp, a deuterium lamp, an Ar resonance line lamp, a Kr resonance line lamp, a Xe resonance line lamp, an excimer lamp, an excimer laser, $Ar^{30}$ laser higher harmonics, a $N_2$ laser, or YAG laser higher harmonics.

[Embodiment 4]

Figure 10:
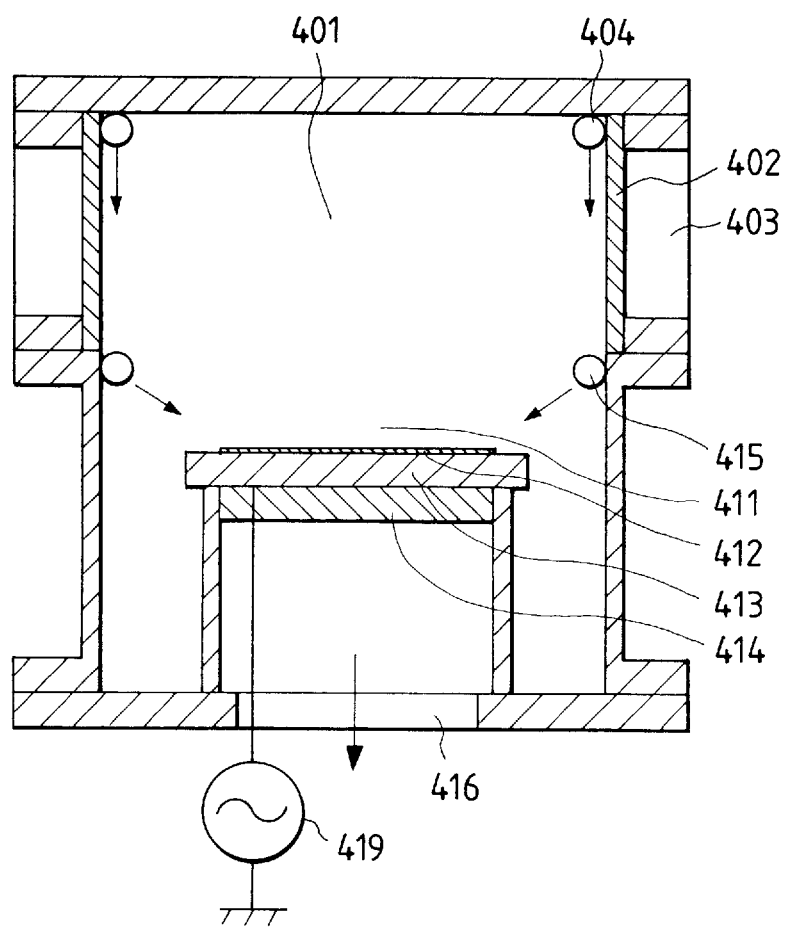

FIG. 10 is a biased plasma processing apparatus constituting an embodiment of the present invention, wherein shown are a plasma generation chamber 401; a dielectric material 402 for separating the plasma generation chamber 401 from the ambient air; a slotted endless annular wave guide tube 403 for introducing the microwave into the plasma generation chamber 401; plasma generating gas introduction means 404; a processing chamber 411 connected to the plasma generation chamber 401; a processed substrate 412; a support member 413 for supporting the processed substrate 412; a heater 414 for heating the processed substrate 412; a processing gas introduction means 415; an evacuating outlet 416; and high frequency supply means 419 for applying a bias to the support member 413.

The generation of plasma and the processing therewith are carried out in the following manner. The interior of the plasma generation chamber 401 and the processing chamber 411 is evacuated by a vacuum system (not shown). Then the processed substrate 412 is heated and maintained at a desired temperature by the heater 414. Also a plasma generating gas is introduced, by gas introduction means 404, into the plasma generation chamber 401 at a predetermined flow rate. Then a conductance valve (not shown) provided in the vacuum system (not shown) is so adjusted as to maintain the interior of the plasma generation chamber 401 and the processing chamber 411 at a predetermined pressure. A desired electric power is supplied from a microwave source (not shown), through the annular wave guide tube 403 into the plasma generation chamber 401, thereby generating plasma therein. Also the high frequency supply means 419 applies a high frequency to the support member 413, thereby generating a self bias on the surface of the processed substrate. A processing gas, introduced into the processing chamber 411 through the processing gas introduction means 415, is excited by the generated high-density plasma, and thus generated ions are accelerated by the self bias and process the surface of the processed substrate 412 placed on the support member 413. The processing gas may also be introduced from the plasma generating gas introduction means 404.

The frequency of the high frequency supply means 419 is advantageously selected in a range of 100 kHz to 20 MHz, preferably 1 to 5 MHz, in consideration of the stability of discharge and generation of self bias.

[Embodiment 5]

A microwave plasma processing apparatus constituting an embodiment of the present invention is shown in FIG. 7, in which, as explained in the foregoing, there are shown a plasma generation chamber 101; a first dielectric material 102 for separating the plasma generation chamber 101 from the ambient air; a slotted endless annular wave guide tube 103 for introducing the microwave into the plasma generation chamber 101; a second dielectric material 704 filling the interior of the annular wave guide tube 103; plasma generating gas introduction means 104; a processing chamber 111 connected to the plasma generation chamber 101; a substrate 112 to be processed; a support member 113 for the processed substrate 112; a heater 114 for heating the processed substrate 112; process gas introduction means 115; and a gas outlet 116.

The annular wave guide tube 103 has a cross-sectional internal dimension of 27×97 mm, same as that of the WRT-2 standard wave guide tube, and has a central diameter of 354 mm. The annular wave guide tube 103 is composed of stainless steel, for maintaining the mechanical strength, and the internal wall is provided with two-layered platings with copper and then with silver, in order to suppress the microwave propagation loss. The interior of the annular wave guide tube 103 is filled with quartz, constituting the second dielectric material 103. The annular wave guide tube 103 is provided with slots for introducing the microwave into the plasma generation chamber 101. The slots have a rectangular shape with a length of 21 mm and a width of 2 mm, and are provided at an interval of ¼ of the guide wavelength. The guide wavelength depends on the frequency of the microwave used, the dielectric constant of the second dielectric material and the cross-sectional dimension of the wave guide tube and is about 80 mm in case of using a microwave of a frequency of 2.45 GHz, quartz as the second dielectric material and the wave guide tube of the above-mentioned dimension. The annular wave guide tube 103 employed in the present embodiment had 56 slots formed at an interval of about 20 mm. To the annular wave guide tube 103, there are connected in succession a 4E tuner, a directional coupler, an isolator and a 2.45 GHz microwave source (not shown).

The generation of plasma and the processing therewith are carried out in the following manner. The interior of the plasma generation chamber 101 and the processing chamber 111 is evacuated by a vacuum system (not shown). Then a plasma generating gas is introduced, through a gas inlet 105, into the plasma generation chamber 101 at a predetermined flow rate. Then a conductance valve (not shown) provided in the vacuum system (not shown) is so adjusted as to maintain the interior of the plasma generation chamber 101 and the processing chamber 111 at a predetermined pressure. A desired electric power is supplied from a microwave source (not shown), through the annular wave guide tube 103 filled with the second dielectric material 104 and through the first dielectric material 102, into the plasma generation chamber 101, thereby generating plasma therein. A processing gas, introduced into the processing chamber 111 through the processing gas introduction tube 115, is excited by the generated high-density plasma, and thus excited gas processes the surface of the processed substrate 112 placed on the support member 113. The processing gas may also be introduced from the plasma generating gas introduction inlet 105, according to the purpose.

In the microwave plasma processing apparatus of the present embodiment shown in FIG. 7, plasma was generated under the conditions of an Ar flow rate of 500 sccm, a pressure of 10 mTorr and a microwave power of 3.0 kW, and the obtained plasma was measured by a single probe method in the following manner. The voltage applied to the probe was varied in a range of −50 to +50 V, and the current obtained in the probe was measured with an I–V meter and the electron density, the electron temperature and the plasma potential were calculated, according to the method of Langmuir et al., from the obtained I–V curve. The obtained electron density was $3.2 \times 10^{12}/cm^3 \pm 4.3\%$ (within a $\phi 200$ plane), indicating the formation of uniform high-density plasma.

[Embodiment 6]

Figure 11:
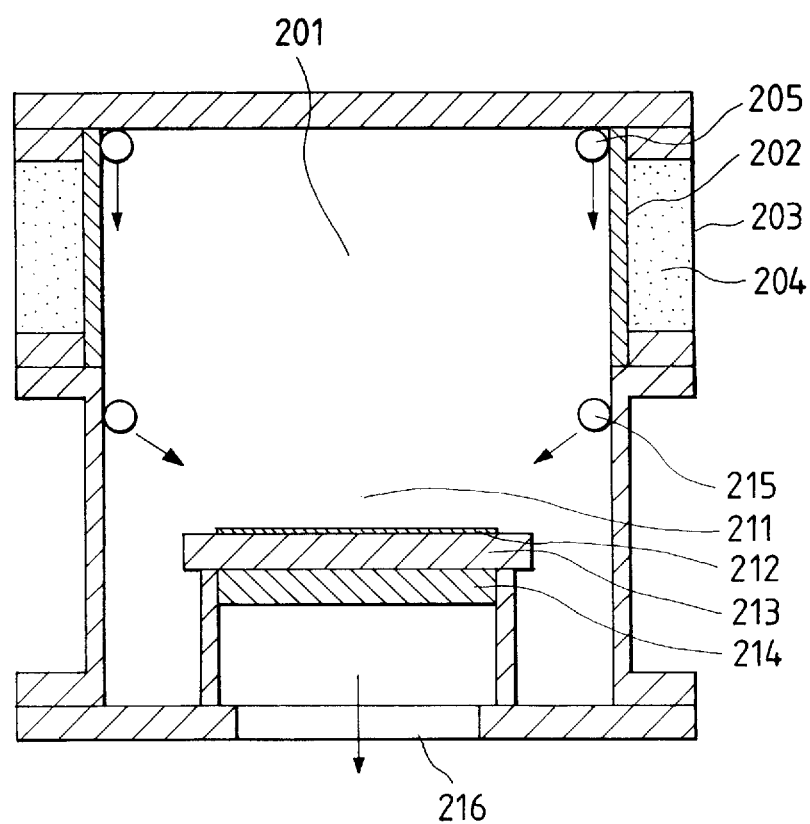

A microwave plasma processing apparatus constituting an embodiment of the present invention is shown in FIG. 11, in which there are shown a plasma generation chamber 201; a first dielectric material 202 for separating the plasma generation chamber 201 from the ambient air; a slotted annular wave guide tube 203 for introducing the microwave into the plasma generation chamber 201; a second dielectric material 204 filling the interior of the annular wave guide tube 203; plasma generating gas introduction means 205; a processing chamber 211 connected to the plasma generation chamber 201; a substrate 212 to be processed; a support member 213 for the processed substrate 212; a heater 214 for heating the processed substrate 212; process gas introduction means 215; and a gas outlet 216. The plasma-substrate distance is larger by 100 mm as compared with the apparatus of Embodiment 1.

The generation of plasma and the processing therewith are carried out in the following manner. The interior of the plasma generation chamber 201 and the processing chamber 211 is evacuated by a vacuum system (not shown). Then a plasma generating gas is introduced, through a gas inlet 205, into the plasma generation chamber 201 at a predetermined flow rate. Then a conductance valve (not shown) provided in the vacuum system (not shown) is so adjusted as to maintain the interior of the plasma generation chamber 201 at a predetermined pressure. A desired electric power is supplied from a microwave source (not shown), through the annular wave guide tube 203 filled with the second dielectric material 204, into the plasma generation chamber 201, thereby generating plasma of a higher density therein. A processing gas, introduced into the processing chamber 211 through the processing gas introduction tube 215, reacts with the plasma generating gas excited by the generated high-density plasma, thereby processing the surface of the substrate 212 placed on the support member 213. The processing gas may also be introduced from the plasma generating gas introduction inlet 205.

[Embodiment 7]

Figure 12:
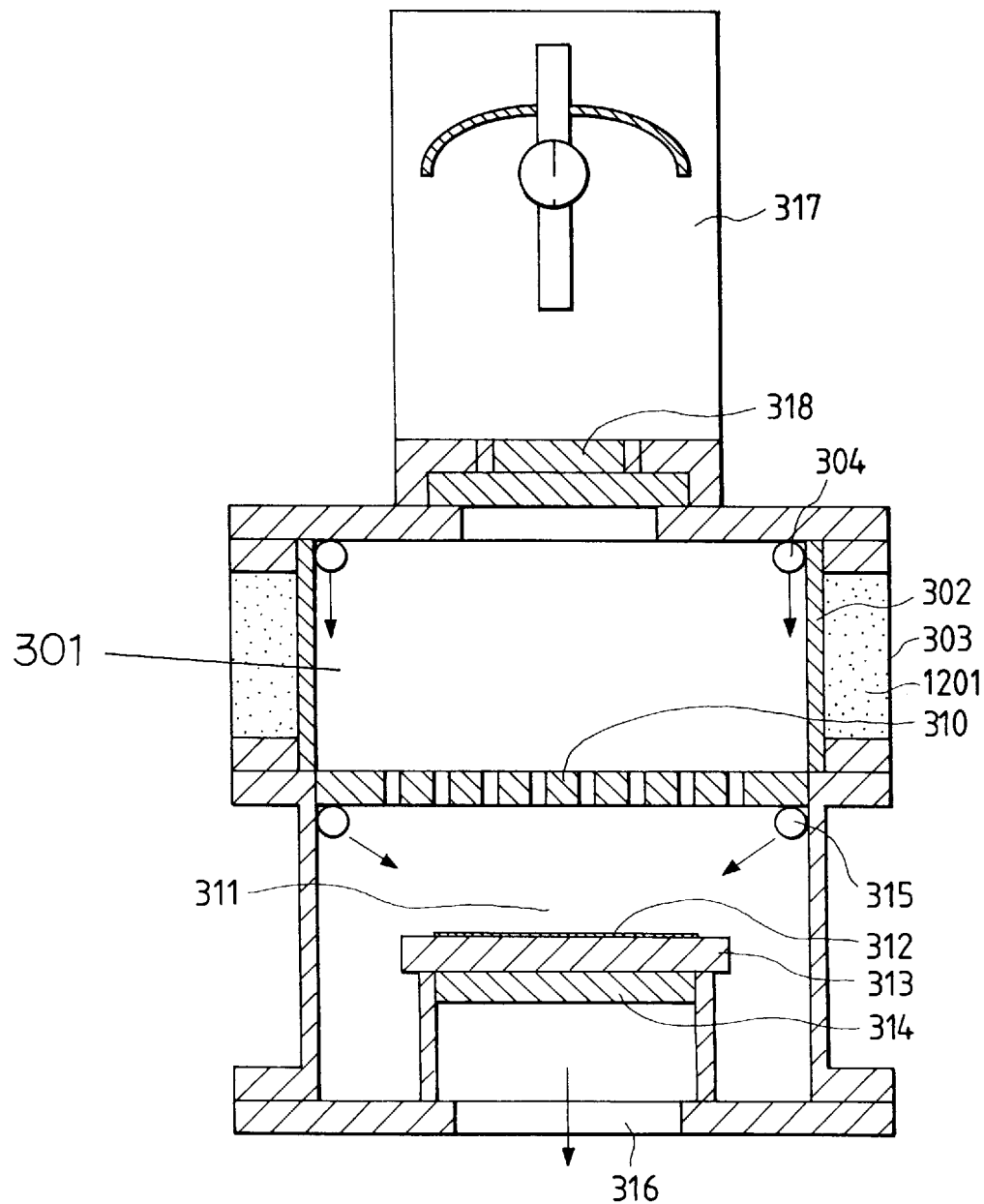

FIG. 12 shows a photo-assisted microwave plasma processing apparatus constituting an embodiment of the present invention, wherein shown are a plasma generation chamber 301; a quartz tube 302 for separating the plasma generation chamber 301 from the ambient air; an annular wave guide tube 303 for introducing the microwave into the plasma generation chamber 301; a second dielectric material 1201 filling the interior of the annular wave guide tube; plasma generating gas introduction means 304; a porous transparent diffusion plate 310; a processing chamber 311 connected to the plasma generation chamber; a processed substrate 312; a support member 313 for the processed substrate 312; a heater 314 for heating the processed substrate 312; processing gas introduction means 315; an evacuation outlet 316; an illumination system 317 for irradiating the surface of the processed substrate 312 with ultraviolet light; and a light introducing window 318 for introducing the visible/ultraviolet light from the illumination system 317 into the processing chamber 311 through the plasma generation chamber 301.

The generation of plasma and the processing therewith are carried out in the following manner. The interior of the plasma generation chamber 301 and the processing chamber 311 are evacuated by a vacuum system (not shown). Then the visible/ultraviolet light from the illumination system 317 is directed to the surface of the processed substrate 312 through the light introducing window 318, and the processed substrate 312 is maintained at a desired temperature. Also a plasma generating gas is introduced, by gas introduction inlet 304, into the plasma generation chamber 301 at a predetermined flow rate. Then a conductance valve (not shown) provided in the vacuum system (not shown) is so adjusted as to maintain the interior of the plasma generation chamber 301 at a predetermined pressure. A desired electric power is supplied from a microwave source (not shown), through the annular wave guide tube 303 filled with the second dielectric material 1201 into the plasma generation chamber 301, thereby generating plasma therein. A processing gas, introduced into the processing chamber 311 through the processing gas introduction tube 315, is excited by the generated high-density plasma, and thus excited gas processes the surface of the processed substrate 312 placed on the support member 313. Processing of higher quality is rendered possible, as the surface of the substrate is activated by the ultraviolet light. The processing gas may also be introduced from the plasma generating gas introduction means 304

The illumination system 317 may utilize any light source emitting light of a wavelength absorbable by the surface of the substrate, or a gas or a precursor deposited on the substrate surface, such as a low-pressure mercury lamp, a xenon-mercury lamp, a deuterium lamp, an Ar resonance line lamp, a Kr resonance line lamp, a Xe resonance line lamp, an excimer lamp, an excimer laser, $Ar^{30}$ laser higher harmonics, an $N_2$ laser, or YAG laser higher harmonics.

[Embodiment 8]

Figure 13:
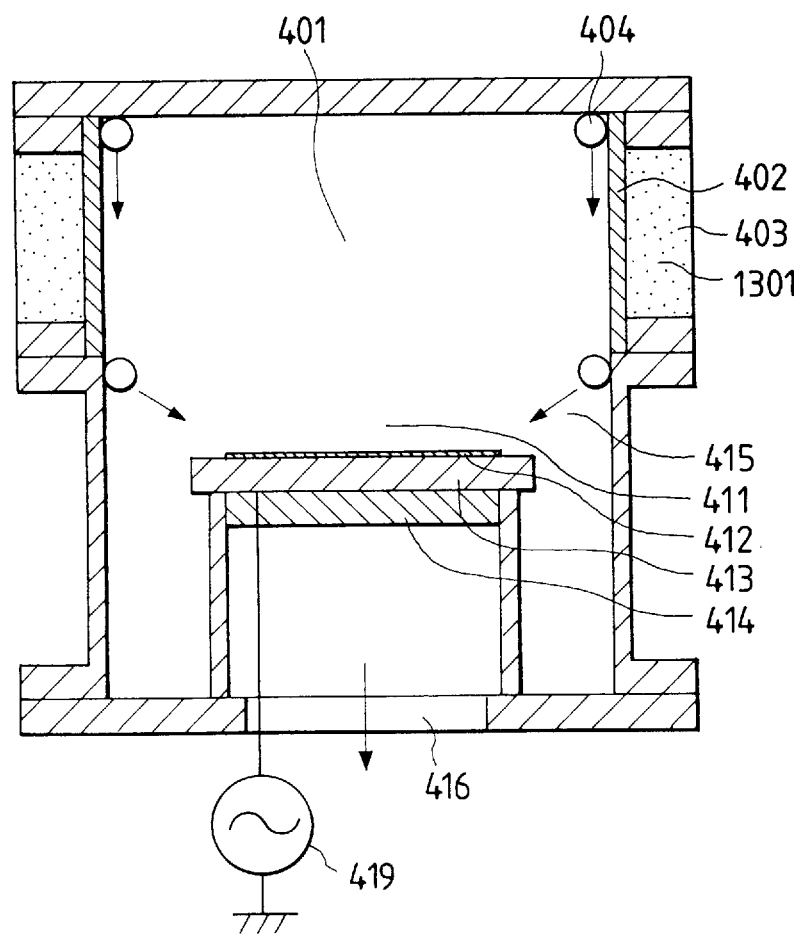

FIG. 13 is a biased plasma processing apparatus constituting an embodiment of the present invention, wherein shown are a plasma generation chamber 401; a first dielectric material 402 constituting the plasma generation chamber 401; an annular wave guide tube 403 for introducing the microwave into the plasma generation chamber 401; a second dielectric material 1301 filling the interior of the annular wave guide tube 403; plasma generating gas introduction means 404; a processing chamber 411 connected to the plasma generation chamber 401; a processed substrate 412; a support member 413 for supporting the processed substrate 412; a heater 414 for heating the processed substrate 412; processing gas introduction means 415; an evacuating outlet 416; and high frequency supply means 419 for applying a bias to the support member 413.

The generation of plasma and the processing therewith are carried out in the following manner. The interior of the plasma generation chamber 401 and the processing chamber 411 is evacuated by a vacuum system (not shown). Then the processed substrate 412 is heated and maintained at a desired temperature by the heater 414. Also a plasma generating gas is introduced, by gas introduction means 404, into the plasma generation chamber 401 at a predetermined flow rate. Then a conductance valve (not shown) provided in the vacuum system (not shown) is so adjusted as to maintain the interior of the plasma generation chamber 401 at a predetermined pressure. A desired electric power is supplied from a microwave source (not shown), through the annular wave guide tube 403 filled with the second dielectric material 1301 into the plasma generation chamber 401, thereby generating plasma therein. Also the high frequency supply means 419 applies a high frequency to the support member 413, thereby generating a self bias on the surface of the processed substrate. A processing gas, introduced into the processing chamber 411 through the processing gas introduction means 415, is excited by the generated high-density plasma, and thus generated ions are accelerated by the self bias and process the surface of the substrate 412 placed on the support member 413. The processing gas may also be introduced from the plasma generating gas introduction means 404.

The frequency of the high frequency supply means 419 is advantageously selected in a range of 100 kHz to 20 MHz, preferably 1 to 5 MHz, in consideration of the stability of discharge and generation of self bias.

In the following there will be explained examples of film formation with the microwave plasma CVD apparatus of the present invention, but it is to be understood that the present invention is not limited by such examples.

[EXAMPLE 1]

The microwave plasma processing apparatus (Embodiment 1) shown in FIG. 5 was employed in the formation of a silicon nitride film for a photomagnetic disk.

As the processed substrate 112, there was used a polycarbonate (PC) substrate (3.5"φ) with grooves of a width of 1.2 μm. After the PC substrate 112 was placed on the support member 113, the plasma generation chamber 101 and the processing chamber 111 were evacuated to $10^{-6}$ Torr by the vacuum system (not shown). Then, through the plasma generating gas introduction means 104, nitrogen gas and argon gas were introduced with respective flow rates of 100 and 600 sccm into the plasma generation chamber 101. At the same time, through the processing gas introduction means 115, monosilane gas was introduced at a flow rate of 200 sccm into the processing chamber 111. Subsequently, the conductance valve (not shown) provided on the vacuum system (not shown) was adjusted to maintain the interior of the processing chamber 111 at 20 mTorr. Then an electric power of 3.0 kW was supplied from the microwave source of 2.45 GHz (not shown) through the annular wave guide tube 103 into the plasma generation chamber 101 to generate plasma therein. The nitrogen gas introduced through the plasma generating gas introduction means 104 was excited and decomposed in the plasma generation chamber 101 to generate active species, which were transported toward the substrate 112 and reacted with the monosilane gas introduced through the processing gas introduction means 115, thereby forming a silicon nitride film of a thickness of 100 nm within 12 seconds on the substrate 112.

After the film formation, the film quality was evaluated. The film forming rate of the silicon nitride film was as large as 500 nm/min, and the film was proved to be excellent in quality, showing a refractive index of 2.2 and having satisfactory adhesion and durability. Also it showed a density of 2.9 g/cm$^3$, denser than in a case where the parameters such as the guide wavelength are not optimized.

[EXAMPLE 2]

The microwave plasma processing apparatus (Embodiment 1) shown in FIG. 5 was employed in the formation of a silicon oxide film and a silicon nitride film for antireflection for a plastic lens.

As the processed substrate 112, there was used a plastic convex lens having a diameter of 50 mm. After the lens 112 was placed on the support member 113, the plasma generation chamber 101 and the processing chamber 111 were evacuated to $10^{-6}$ Torr by the vacuum system (not shown). Then, through the plasma generating gas introduction means 104, nitrogen gas was introduced with a flow rate of 150 sccm into the plasma generation chamber 101. At the same time, through the processing gas introduction means 115, monosilane gas was introduced at a flow rate of 100 sccm into the processing chamber 111. Subsequently, the conductance valve (not shown) provided on the vacuum system (not shown) was adjusted to maintain the interior of the processing chamber 111 at 5 mTorr. Then an electric power of 3.0 kW was supplied from the microwave source of 2.45 GHz (not shown) through the annular wave guide tube 103 into the plasma generation chamber 101 to generate plasma therein. The nitrogen gas introduced through the plasma generating gas introduction means 104 was excited and decomposed in the plasma generation chamber 101 to generate active species such as nitrogen atoms, which were transported toward the lens 112 and reacted with the monosilane gas introduced through the processing gas introduction means 115, thereby forming a silicon nitride film of a thickness of 21 nm on the lens 112.

Then, through the plasma generating gas introduction means 104, oxygen gas was introduced with a flow rate of 200 sccm into the plasma generation chamber 101. At the same time, through the processing gas introduction means 115, monosilane gas was introduced at a flow rate of 100 sccm into the processing chamber 111. Subsequently, the conductance valve (not shown) provided on the vacuum system (not shown) was adjusted to maintain the interior of the processing chamber 111 at 1 mTorr. Then an electric power of 2.0 kW was supplied from the microwave source of 2.45 GHz (not shown) through the annular wave guide tube 103 filled with quartz into the plasma generation chamber 101 to generate plasma therein. The oxygen gas introduced through the plasma generating gas introduction means 104 was excited and decomposed in the plasma generation chamber 101 to generate active species such as oxygen atoms, which were transported toward the lens 112 and reacted with the monosilane gas introduced through the processing gas introduction means 115, thereby forming a silicon oxide film of a thickness of 86 nm on the lens 112.

After the film formation, the film forming speed and the reflective characteristics were evaluated. The film forming speeds of the obtained silicon nitride film and silicon oxide film were respectively as large as 300 and 360 nm/min, and the film proved to show excellent optical characteristics, having a reflectance of 0.3% around 500 nm.

[EXAMPLE 3]

The microwave plasma processing apparatus (Embodiment 1) shown in FIG. 5 was employed in the formation of a silicon nitride film for protection of a semiconductor element.

As the processed substrate 112, there was used a p-type single-crystal silicon substrate (face orientation <100>, resistivity 10 Ωcm) having an interlayer SiO$_2$ film with Al wiring patterns (line-and-space 0.5 μm). After the silicon substrate 112 was placed on the support member 113, the plasma generation chamber 101 and the processing chamber 111 were evacuated to $10^{-6}$ Torr by the vacuum system (not shown). Then, the heater 114 was activated to heat and maintain the silicon substrate 112 at 300° C., and, through the plasma generating gas introduction means 104, nitrogen gas was introduced with a flow rate of 500 sccm into the plasma generation chamber 101. At the same time, through the processing gas introduction means 115, monosilane gas was introduced at a flow rate of 100 sccm into the processing chamber 111. Subsequently, the conductance valve (not shown) provided on the vacuum system (not shown) was adjusted to maintain the interior of the processing chamber 111 at 20 mTorr. Then an electric power of 3.0 kW was supplied from the microwave source of 2.45 GHz (not shown) through the annular wave guide tube 103 filled with quartz into the plasma generation chamber 101 to generate plasma therein. The nitrogen gas introduced through the plasma generating gas introduction means 104 was excited and decomposed in the plasma generation chamber 101 to generate active species, which were transported toward the silicon substrate 112 and reacted with the monosilane gas introduced through the processing gas introduction means 115, thereby forming a silicon nitride film of a thickness of 1.0 μm on the silicon substrate 112.

After the film formation, the film forming speed and the film quality such as stress were evaluated. The film forming rate of the silicon nitride film was as large as 460 nm/min, and the film was proved to be excellent in quality, showing a stress of $1.1 \times 10^9$ dyn/cm$^2$ (compressive), a leakage current of $1.2 \times 10^{-10}$ A/cm$^2$ and a dielectric strength of 9 MV/cm. The stress was determined by measuring the change in bending amount of the substrate before and after the film formation, by a laser interferometer from Zygo (trade name).

[EXAMPLE 4]

The microwave plasma processing apparatus (Embodiment 1) shown in FIG. 5, with magnetic field generation means (coil), was employed in etching of a BPSG film of a semiconductor element.

As the processed substrate 112, there was used a p-type single-crystal silicon substrate (face orientation <100>, resistivity 10 Ωcm) having a BPSG film of 1 μm in thickness, on a polysilicon pattern (line-and-space 0.5 μm). After the silicon substrate 112 was placed on the support member 113, the plasma generation chamber 101 and the processing chamber 111 were evacuated to $10^{-6}$ Torr by the vacuum system (not shown). Then, through the plasma generating gas introduction means 104, $CF_4$ was introduced with a flow rate of 300 sccm into the plasma generation chamber 101. Subsequently, the conductance valve (not shown) provided on the vacuum system (not shown) was adjusted to maintain the interior of the plasma generation chamber 101 at 0.5 mTorr. Then an electric power was supplied from a DC source (not shown) to the coil (not shown) to generate a magnetic field of a maximum magnetic flux density of 90 mT in the plasma generation chamber 101, and an electric power of 1.5 kW was supplied from the microwave source of 2.45 GHz, through the annular wave guide tube 103, into the plasma generation chamber 101 to generate plasma therein. The $CF_4$ gas introduced through the plasma generating gas introduction means 104 was excited and decomposed in the plasma generation chamber 101 to generate active species, which were transported toward the silicon substrate 112 to each BPSG film.

After the etching, the etching rate, the selectivity ratio and the etching profile were evaluated. The etching profile was evaluated by observation of the cross-section of the etched silicon oxide film with a scanning electron microscope (SEM). The etching rate and the selectivity ratio to polysilicon, being respectively 300 nm/min and 30, are both satisfactory. Also the etching profile was almost vertical, showing little microloading effect.

[EXAMPLE 5]

The microwave plasma processing apparatus (Embodiment 2) shown in FIG. 5 was employed in the formation of a silicon oxide film for gate insulation for a semiconductor element.

As the processed substrate 112, there was used a p-type single-crystal silicon substrate (face orientation <100>, resistivity 10 Ωcm). After the silicon substrate 112 was placed on the support member 113, the plasma generation chamber 101 and the processing chamber 111 were evacuated to $10^{-6}$ Torr by the vacuum system (not shown). Then, the heater 114 was activated to heat and maintain the silicon substrate 112 at 300° C., and, through the plasma generating gas introduction means 104, oxygen gas was introduced with a flow rate of 200 sccm into the plasma generation chamber 101. At the same time, through the processing gas introduction means 115, monosilane gas was introduced at a flow rate of 50 sccm into the processing chamber 111. Subsequently, the conductance valve (not shown) provided on the vacuum system (not shown) was adjusted to maintain the interior of the plasma generation chamber 101 and the processing chamber 111 at 20 mTorr. Then an electric power of 1.5 kW was supplied from the microwave source of 2.45 GHz (not shown) through the annular wave guide tube 103 into the plasma generation chamber 101 to generate plasma therein. The oxygen gas introduced through the plasma generating gas introduction means 104 was excited and decomposed in the plasma generation chamber 101 to generate active species such as oxygen atoms, which were transported toward the silicon substrate 112 and reacted with the monosilane gas introduced through the processing gas introduction means 115, thereby forming a silicon oxide film of a thickness of 0.1 μm on the silicon substrate 112.

After the film formation, the film forming speed, the uniformity, the leakage current, the dielectric strength and the interface state density were evaluated. The silicon oxide film was satisfactory, showing a film forming speed of 120 nm/min, and a uniformity of ±2.2%. Also the film proved to be excellent in quality, showing a leakage current of $5 \times 10^{-11}$ A/cm$^2$, a dielectric strength of 10 MV/cm and an interface state density of $5 \times 10^{10}$ cm$^{-2}$. The interface state density was determined from the C-V curve, in case of high frequency application of 1 MHz, measured with a capacity meter.

[EXAMPLE 6]

The photo-assisted microwave plasma processing apparatus (Embodiment 3) shown in FIG. 9 was employed in the formation of a silicon oxide film for interlayer insulation for a semiconductor element.

As the processed substrate 312, there was used a p-type single-crystal silicon substrate (face orientation <100>, resistivity 10 Ωcm) bearing, at the uppermost part, an Al wiring pattern (line-and-space 0.5 μm). After the silicon substrate 312 was placed on the support member 313, the plasma generation chamber 301 and the processing chamber 311 were evacuated to $10^{-6}$ Torr by the vacuum system (not shown). Then, a KrCl* excimer lamp of the illumination means 317 was turned on to irradiate the surface of the silicon substrate 312 with an illumination intensity at the surface of 20 mW/cm$^2$. Then the heater 314 was activated to heat and maintain the silicon substrate 312 at 300° C., and, through the plasma generating gas introduction means 304, oxygen gas was introduced with a flow rate of 500 sccm into the plasma generation chamber 301. At the same time, through the processing gas introduction means 315, tetraethoxysilane (TEOS) gas was introduced at a flow rate of 200 sccm into the plasma generation chamber 311. Subsequently, the conductance valve (not shown) provided on the vacuum system (not shown) was adjusted to maintain the interior of the processing chamber 301 at 0.1 Torr and that of the processing chamber 311 at 0.05 Torr. Then an electric power of 1.5 kW was supplied from the microwave source of 2.45 GHz (not shown) through the annular wave guide tube 303 into the plasma generation chamber 301 to generate plasma therein. The oxygen gas introduced through the plasma generating gas introduction means 304 was excited and decomposed in the plasma generation chamber 301 to generate active species, which were transported toward the silicon substrate 312 and reacted with the tetraethoxysilane gas introduced through the processing gas introduction means 315, thereby forming a silicon oxide film of a thickness of 0.8 μm on the silicon substrate 312.

After the film formation, the film forming speed, the uniformity, the dielectric strength and the step coverage were evaluated. The silicon oxide film showed a film forming speed of 190 nm/min, and a uniformity of ±2.5%, both in satisfactory range. Also the film proved to be satisfactory in quality, showing a dielectric strength of 9.5 MV/cm and a cover factor of 0.9. The cover factor (step coverage) is defined by the ratio of the film thickness on the step sidewall portion to that on the step of the silicon oxide film formed on the Al wiring pattern, observed under a scanning electron microscope (SEM).

[EXAMPLE 7]

The biased microwave plasma processing apparatus (Embodiment 4) shown in FIG. 10 was employed in the etching of a polysilicon film between the gate electrodes of a semiconductor element.

As the processed substrate 412, there was used a p-type single-crystal silicon substrate (face orientation <100>, resistivity 10 Ωcm) bearing, at the uppermost part, a polysilicon film. After the silicon substrate 412 was placed on the support member 413, the plasma generation chamber 401 and the processing chamber 411 were evacuated to $10^{-6}$ Torr by the vacuum system (not shown). Then, through the plasma generating gas introduction means 404, $CF_4$ gas and oxygen gas were introduced with respective flow rates of 300 and 20 sccm into the plasma generation chamber 401. Subsequently, the conductance valve (not shown) provided on the vacuum system (not shown) was adjusted to maintain the interior of the plasma generation chamber 401 at 0.5 mTorr. Then a high frequency power of 400 kHz was applied by the high frequency application means 419 to the support member 413 and an electric power of 1.5 kW was supplied from the microwave source of 2.45 GHz through the annular wave guide tube 403 into the plasma generation chamber 401 to generate plasma therein. The $CF_4$ gas and the oxygen gas introduced through the plasma generating gas introduction means 404 were excited and decomposed in the plasma generation chamber 401 to generate active species, which were transported toward the silicon substrate 412, and the polysilicon film was etched with the ions accelerated by the self bias.

After the etching, the etching speed, the selectivity ratio and the etching profile were evaluated. Satisfactory performances were obtained, with an etching speed of 600 nm/min and a selectivity ratio to $SiO_2$ of 30. Also the etching profile was more vertical in comparison with the case without high frequency application, with little microloading effect. The etching profile was evaluated by the cross-section of the etched polysilicon film, observed under a scanning electron microscope (SEM).

[EXAMPLE 8]

The microwave plasma processing apparatus shown in FIG. 7 was employed in the formation of a silicon nitride film for a photomagnetic disk.

As the processed substrate 112, there was used a polycarbonate (PC) substrate (3.5"φ) with grooves of a width of 1.2 μm. After the PC substrate 112 was placed on the support member 113, the plasma generation chamber 101 and the processing chamber 111 were evacuated to $10^{-6}$ Torr by the vacuum system (not shown). Then, through the plasma generating gas introduction means 104, nitrogen gas and argon gas were introduced with respective flow rates of 100 and 600 sccm into the plasma generation chamber 101. At the same time, through the processing gas introduction means 115, monosilane gas was introduced at a flow rate of 200 sccm into the processing chamber 111. Subsequently, the conductance valve (not shown) provided on the vacuum system (not shown) was adjusted to maintain the interior of the processing chamber 111 at 20 mTorr. Then an electric power of 3.0 kW was supplied from the microwave source of 2.45 GHz (not shown) through the annular wave guide tube 103 filled with quartz 704 into the plasma generation chamber 101 to generate plasma therein. The nitrogen gas introduced through the plasma generating gas introduction inlet 104 was excited and decomposed in the plasma generation chamber 101 to generate active species, which were transported toward the silicon substrate 112 and reacted with the monosilane gas introduced through the processing gas introduction means 115, thereby forming a silicon nitride film of a thickness of 100 nm within 12 seconds on the silicon substrate 112. After the film formation, the film quality, such as refractive index, was evaluated.

The film forming rate of the silicon nitride film was as large as 500 nm/min, and the film proved to be excellent in quality, showing a refractive index of 2.2 and having satisfactory adhesion and durability. Also it showed a density of 2.9 g/cm$^3$, denser than in a case without the filling with the second dielectric material 704.

[EXAMPLE 9]

The microwave plasma processing apparatus shown in FIG. 7 was employed in the formation of a silicon oxide film and a silicon nitride film for antireflection for a plastic lens.

As the processed substrate 112, there was used a plastic convex lens having a diameter of 50 mm. After the lens 112 was placed on the support member 113, the plasma generation chamber 101 and the processing chamber 111 were evacuated to $10^{-6}$ Torr by the vacuum system (not shown). Then, through the plasma generating gas introduction inlet 104, nitrogen gas was introduced with a flow rate of 150 sccm into the plasma generation chamber 201. At the same time, through the processing gas introduction means 115, monosilane gas was introduced at a flow rate of 100 sccm into the processing chamber 111. Subsequently, the conductance valve (not shown) provided on the vacuum system (not shown) was adjusted to maintain the interior of the processing chamber 111 at 5 mTorr. Then an electric power of 3.0 kW was supplied from the microwave source of 2.45 GHz (not shown) through the annular wave guide tube 103 filled with quartz 704 into the plasma generation chamber 101 to generate plasma therein. The nitrogen gas introduced through the plasma generating gas introduction inlet 104 was excited and decomposed in the plasma generation chamber 101 to generate active species such as nitrogen atoms, which were transported toward the lens 112 and reacted with the monosilane gas introduced through the processing gas introduction means 115, thereby forming a silicon nitride film of a thickness of 21 nm on the lens 112.

Then, through the plasma generating gas introduction inlet 104, oxygen gas was introduced with a flow rate of 200 sccm into the plasma generation chamber 101. At the same time, through the processing gas introduction means 115, monosilane gas was introduced at a flow rate of 100 sccm into the processing chamber 111. Subsequently, the conductance valve (not shown) provided on the vacuum system (not shown) was adjusted to maintain the interior of the processing chamber 111 at 1 mTorr. Then an electric power of 2.0 kW was supplied from the microwave source of 2.45 GHz (not shown) through the annular wave guide tube 103 filled with quartz 704 into the plasma generation chamber 101 to generate plasma therein. The oxygen gas introduced through the plasma generating gas introduction means 104 was excited and decomposed in the plasma generation chamber 101 to generate active species such as oxygen atoms, which were transported toward the lens 112 and reacted with the monosilane gas introduced through the processing gas introduction means 115, thereby forming a silicon oxide film of a thickness of 86 nm on the lens 112. After the film formation, the film forming speed and the reflective characteristics were evaluated.

The film forming speeds of the silicon nitride film and silicon oxide film were, respectively as large as 300 and 360 nm/min, and the film proved to show excellent optical characteristics, having a reflectance of 0.3% around 500 nm.

[EXAMPLE 10]

The microwave plasma processing apparatus shown in FIG. 7 was employed in the formation of a silicon nitride film for protection for a semiconductor element.

As the processed substrate 112, there was used a p-type single-crystal silicon substrate (face orientation <100>, resistivity 10 Ωcm) having an interlayer $SiO_2$ film with an Al wiring pattern (line-and-space 0.5 μm). After the silicon substrate 112 was placed on the support member 113, the plasma generation chamber 101 and the processing chamber 111 were evacuated to $10^{-6}$ Torr by the vacuum system (not shown). Then, the heater (not shown) was activated to heat and maintain the silicon substrate 112 at 300° C., and, through the plasma generating gas introduction inlet 104, nitrogen gas was introduced with a flow rate of 500 sccm into the plasma generation chamber 101. At the same time, through the processing gas introduction means 115, monosilane gas was introduced at a flow rate of 100 sccm into the processing chamber 111. Subsequently, the conductance valve (not shown) provided on the vacuum system (not shown) was adjusted to maintain the interior of the processing chamber 111 at 20 mTorr. Then an electric power of 3.0 kW was supplied from the microwave source of 2.45 GHz (not shown) through the annular wave guide tube 103 filled with quartz 704 into the plasma generation chamber 101 to generate plasma therein. The nitrogen gas introduced through the plasma generating gas introduction inlet 104 was excited and decomposed in the plasma generation chamber 101 to generate active species, which were transported toward the silicon substrate 112 and reacted with the monosilane gas introduced through the processing gas introduction means 115, thereby forming a silicon nitride film of a thickness of 1.0 μm on the silicon substrate 112. After the film formation, the film forming speed and the film quality such as stress were evaluated. The stress was determined by measuring the change in bending amount of the substrate before and after the film formation, by a laser interferometer from Zygo (trade name).

The film forming rate of the silicon nitride film was as large as 460 nm/min, and the film proved to be excellent in quality, showing a stress of $1.1 \times 10^9$ dyn/cm$^2$ (compressive), a leakage current of $1.2 \times 10^{-10}$ A/cm$^2$ and a dielectric strength of 9 MV/cm.

[EXAMPLE 11]

The microwave plasma processing apparatus shown in FIG. 7 was employed in the etching of a BPSG film of a semiconductor element.

As the processed substrate 112, there was used a p-type single-crystal silicon substrate (face orientation <100>, resistivity 10 Ωcm) having a BPSG film of 1 μm in thickness, on a polysilicon pattern (line-and-space 0.5 μm). After the silicon substrate 112 was placed on the support member 113, the plasma generation chamber 101 and the processing chamber 111 were evacuated to $10^{-6}$ Torr by the vacuum system (not shown). Then, through the plasma generating gas introduction inlet 104, $CF_4$ was introduced with a flow rate of 300 sccm into the plasma generation chamber 101. Subsequently, the conductance valve (not shown) provided on the vacuum system (not shown) was adjusted to maintain the interior of the plasma generation chamber 101 at 0.5 mTorr. Then an electric power was supplied from a DC source (not shown) to a coil (not shown) to generate a magnetic field of a maximum magnetic flux density of 90 mT in the plasma generation chamber 101, and an electric power of 1.5 kW was supplied from the microwave source of 2.45 GHz, through the annular wave guide tube 103, into the plasma generation chamber 101 to generate plasma therein. The $CF_4$ gas introduced through the plasma generating gas introduction inlet 104 was excited and decomposed in the plasma generation chamber 101 to generate active species, which were transported toward the silicon substrate 112 to etch the BPSG film. After the etching, the etching rate, the selectivity ratio and the etching profile were evaluated. The etching profile was evaluated by observation of the cross section of the etched silicon oxide film with a scanning electron microscope (SEM).

The etching rate and the selectivity ratio to polysilicon, being respectively 300 nm/min and 30, are both satisfactory. Also the etching profile was almost vertical, showing little microloading effect.

[EXAMPLE 12]

The distant type microwave plasma processing apparatus shown in FIG. 11 was employed in the formation of a silicon oxide film for gate insulation for a semiconductor element.

As the processed substrate 212, there was used a p-type single-crystal silicon substrate (face orientation <100>, resistivity 10 Ωcm). After the silicon substrate 212 was placed on the support member 213, the plasma generation chamber 201 and the processing chamber 211 were evacuated to $10^{-6}$ Torr by the vacuum system (not shown). Then, the heater (not shown) was activated to heat and maintain the silicon substrate 212 at 300° C., and, through the plasma generating gas introduction inlet 205, oxygen gas was introduced with a flow rate of 200 sccm into the plasma generation chamber 201. At the same time, through the processing gas introduction means 215, monosilane gas was introduced at a flow rate of 50 sccm into the processing chamber 211. Subsequently, the conductance valve (not shown) provided on the vacuum system (not shown) was adjusted to maintain the interior of the plasma generation chamber 201 and the processing chamber 211 at 20 mTorr. Then an electric power of 1.5 kW was supplied from the microwave source of 2.45 GHz (not shown) through the annular wave guide tube 203 filled with quartz 204 into the plasma generation chamber 201 to generate plasma therein. The oxygen gas introduced through the plasma generating gas introduction inlet 205 was excited and decomposed in the plasma generation chamber 201 to generate active species such as oxygen atoms, which were transported toward the silicon substrate 212 and reacted with the monosilane gas introduced through the processing gas introduction means 215, thereby forming a silicon oxide film of a thickness of 0.1 μm on the silicon substrate 212. After the film formation, the film forming speed, the uniformity, the leakage current, the dielectric strength and the interface state density were evaluated. The interface state density was determined from the C-V curve, in case of high frequency application of 1 MHz, measured with a capacity meter.

The silicon oxide film was satisfactory, showing a film forming speed of 110 nm/min, and a uniformity of ±2.3%. Also the film proved to be excellent in quality, showing a leakage current of $4 \times 10^{-11}$ A/cm$^2$, a dielectric strength of 11 MV/cm and an interface state density of $6 \times 10^{10}$ cm$^{-2}$.

[EXAMPLE 13]

The photo-assisted microwave plasma processing apparatus shown in FIG. 12 was employed in the formation of an interlayer insulation silicon oxide film for a semiconductor element.

As the processed substrate 312, there was used a p-type single-crystal silicon substrate (face orientation <100>, resistivity 10 Ωcm) bearing, at the uppermost part, an Al wiring pattern (line-and-space 0.5 μm). After the silicon substrate 312 was placed on the support member 313, the plasma generation chamber 301 and the processing chamber 311 were evacuated to $10^{-6}$ Torr by the vacuum system (not shown). Then, a KrCl* excimer lamp of the illumination means 317 was turned on to irradiate the surface of the silicon substrate 312 with an illumination intensity at the surface of 20 mW/cm$^2$. Then the heater (not shown) was activated to heat and maintain the silicon substrate 312 at 300° C., and, through the plasma generating gas introduction inlet 304, oxygen gas was introduced with a flow rate of 500 sccm into the plasma generation chamber 301. At the same time, through the processing gas introduction means 315, tetraethoxysilane (TEOS) gas was introduced at a flow rate of 200 sccm into the processing chamber 311. Subsequently, the conductance valve (not shown) provided on the vacuum system (not shown) was adjusted to maintain the interior of the plasma generation chamber 301 at 0.1 Torr and that of the processing chamber 311 at 0.05 Torr. Then an electric power of 1.5 kW was supplied from the microwave source of 2.45 GHz (not shown) through the annular wave guide tube 303 filled with quartz 1201 into the plasma generation chamber 301 to generate plasma therein. The oxygen gas introduced through the plasma generating gas introduction inlet 304 was excited and decomposed in the plasma generation chamber 301 to generate active species, which were transported toward the silicon substrate 312 and reacted with the tetraethoxysilane gas introduced through the processing gas introduction means 315, thereby forming a silicon oxide film of a thickness of 0.8 μm on the silicon substrate 312. After the film formation, the film forming speed, the uniformity, the dielectric strength and the step coverage were evaluated. The step coverage was defined by the ratio (cover factor) of the film thickness on the step sidewall portion to that on the step of the silicon oxide film formed on the Al wiring pattern, observed under a scanning electron microscope (SEM).

The silicon oxide film showed a film forming speed of 180 nm/min, and a uniformity of ±2.7%, both in satisfactory range. Also the film proved to be satisfactory in quality, showing a dielectric strength of 9.3 MV/cm and a cover factor of 0.9.

[EXAMPLE 14]

The biased microwave plasma processing apparatus shown in FIG. 13 was employed in the etching of a polysilicon film between the gate electrodes of a semiconductor element.

As the processed substrate 412, there was used a p-type single-crystal silicon substrate (face orientation <100>, resistivity 10 Ωcm) bearing, at the uppermost part, a polysilicon film. After the silicon substrate 412 was placed on the support member 413, the plasma generation chamber 401 and the processing chamber 411 were evacuated to $10^{-6}$ Torr by the vacuum system (not shown). Then, through the plasma generating gas introduction inlet 404, CF$_4$ gas and oxygen gas were introduced with respective flow rates of 300 and 20 sccm into the plasma generation chamber 401. Subsequently, the conductance valve (not shown) provided on the vacuum system (not shown) was adjusted to maintain the interior of the plasma generation chamber 401 at 0.5 mTorr. Then a high frequency power of 400 kHz was applied by the high frequency application means 419 to the support member 413 and an electric power of 1.5 kW was supplied from the microwave source of 2.45 GHz through the annular wave guide tube 403 into the plasma generation chamber 401 to generate plasma therein. The CF$_4$ gas and oxygen gas introduced through the plasma generating gas introduction inlet 404 were excited and decomposed in the plasma generation chamber 401 to generate active species, which were transported toward the silicon substrate 412, and the polysilicon film was etched with the ions accelerated by the self bias. After the film formation, the etching rate, the selectivity ratio and the etching profile were evaluated. The etching profile was evaluated by the cross section of the etched polysilicon film, observed under a scanning electron microscope (SEM).

Satisfactory performances were obtained, with an etching rate of 600 nm/min and a selectivity ratio to SiO$_2$ of 30. Also the etching profile was more vertical in comparison with the case without high frequency application, with little microloading effect.

As will be apparent from the foregoing description, the present invention enables periodic excitation of the surface wave of the microwave propagating in an dielectric material to realize stronger and more efficient propagation, thereby providing a plasma processing apparatus and a method therefor capable of generating uniform, highly-dense plasma over a large area with a low power, thus achieving high-quality processing at a high speed even at a low temperature.

Also by filling the interior of the annular wave guide tube with a second dielectric material which is the same as or different from a first dielectric material for separating the plasma generation chamber from the ambient air and in particular by selecting the ratio of the dielectric constants of the first and second dielectric materials substantially equal to the reciprocal of the square ratio of the circumferential lengths of the first and second dielectric materials, there can be provided a plasma processing apparatus and a method therefor capable of generating plasma with higher uniformity and density over a larger area with a lower power, thus achieving higher-quality processing at a higher speed at a lower temperature.

What is claimed is:

1. A microwave plasma processing apparatus comprising:
    a plasma generation chamber of which periphery is separated from ambient air by a dielectric member;
    microwave introduction means utilizing an endless annular wave guide tube provided around said plasma generation chamber and having plural slots;
    a processing chamber connected to said plasma generation chamber;
    support means for a substrate to be processed, provided in said processing chamber;
    gas introduction means for said plasma generation chamber and said processing chamber; and evacuation means for said plasma generation chamber and said processing chamber;

wherein a circumferential length $L_g$ of said endless annular wave guide tube, a wavelength $\lambda_g$ of the microwave in said endless annular wave guide tube, a circumferential length $L_s$ of said dielectric member and a wavelength $\lambda_s$ of the surface wave propagating in said dielectric member substantially satisfy a relationship:

$$L_s/\lambda_s = (2n+1)L_g/\lambda_g$$

wherein n is 0 or a natural number.

2. A microwave processing apparatus according to claim 1, further comprising magnetic field generation means.

3. A microwave processing apparatus according to claim 2, wherein said magnetic field generation means is adapted to control the magnetic field in the vicinity of the slots at a magnetic flux density approximately equal to $3.57 \times 10^{-11}$ (T/Hz) times of a frequency of the microwave.

4. A microwave processing apparatus according to claim 1, wherein said substrate support means is provided at a position distant from a generation area of said plasma.

5. A microwave processing apparatus according to claim 1, further comprising means for irradiating the substrate to be processed with optical energy.

6. A microwave processing apparatus according to claim 5, wherein said optical energy includes ultraviolet light.

7. A microwave processing apparatus according to claim 1, further comprising high frequency supply means connected to said support means.

8. A microwave processing apparatus according to claim 1, wherein said wave guide tube is provided therein with a first dielectric material.

9. A microwave processing apparatus according to claim 1, wherein said wave guide tube is provided therein with a second dielectric material which is different from said first dielectric material.

10. A microwave plasma processing apparatus comprising:

a plasma generation chamber of which periphery is separated from ambient air by a dielectric member;

microwave introduction means utilizing a endless annular wave guide tube provided around said plasma generation chamber and having plural slots;

a processing chamber connected to said plasma generation chamber;

support means for a substrate to be processed, provided in said processing chamber;

gas introduction means for said plasma generation chamber and said processing chamber; and evacuation means for said plasma generation chamber and said processing chamber;

wherein a central radius $R_g$ of said endless annular wave guide tube, a wavelength $\lambda_g$ of the microwave in said endless annular wave guide tube, a central radius $R_s$ of the dielectric member and a wavelength $\lambda_s$ of the surface wave propagating in said dielectric member substantially satisfy a relationship:

$$R_s/\lambda_s = (2n+1)R_g/\lambda_g$$

wherein n is 0 or a natural number.

11. A microwave processing apparatus according to claim 10, further comprising a magnetic field generation means.

12. A microwave processing apparatus according to claim 11, wherein said magnetic field generation means is adapted to control the magnetic field in the vicinity of the slots at a magnetic flux density approximately equal to $3.57 \times 10^{-11}$ (T/Hz) times of a frequency of the microwave.

13. A microwave processing apparatus according to claim 10, wherein said substrate support means is so provided as to place the substrate at a position distant from a generation area of said plasma.

14. A microwave processing apparatus according to claim 10, further comprising means for irradiating the substrate to be processed with optical energy.

15. A microwave processing apparatus according to claim 14, wherein said optical energy includes ultraviolet light.

16. A microwave processing apparatus according to claim 10, further comprising high frequency supply means connected to said support means.

17. A microwave processing apparatus according to claim 10, wherein said wave guide tube is provided therein with a first dielectric material.

18. A microwave processing apparatus according to claim 10, wherein said wave guide tube is provided therein with a second dielectric material which is different from said first dielectric material.

19. A microwave plasma processing apparatus comprising:

a plasma generation chamber separated from ambient air by a first dielectric material;

a processing chamber connected to said plasma generation chamber;

means for supporting a substrate to be processed, provided in said processing chamber;

microwave introduction means utilizing an endless annular wave guide tube provided around said plasma generation chamber and provided with plural slots;

means for introducing gas for said plasma generation chamber and said processing chamber; and evacuation means for said plasma generation chamber and said processing chamber;

wherein an interior of said annular wave guide tube is filled with a second dielectric material which is the same as or different from said first dielectric material.

20. A microwave processing apparatus according to claim 19, wherein a ratio of dielectric constants of said first and second dielectric materials is approximately equal to a reciprocal of a square of the ratio of a circumferential lengths of said first and second dielectric materials.

21. A microwave processing apparatus according to claim 19, further comprising a magnetic field generation means.

22. A microwave processing apparatus according to claim 21, wherein the magnetic field in the vicinity of the slots has a magnetic flux density approximately equal to $3.57 \times 10^{-11}$ (T/Hz) times of a frequency of the microwave.

23. A microwave processing apparatus according to claim 19, wherein said substrate support means is provided at a position distant from a generation area of said plasma.

24. A microwave processing apparatus according to claim 19, further comprising means for irradiating the substrate to be processed with optical energy.

25. A microwave processing apparatus according to claim 19, further comprising high frequency supply means connected to said support means.

26. A microwave plasma processing method utilizing a microwave plasma processing apparatus comprising a plasma generation chamber of which periphery is separated from ambient air by a dielectric member; microwave introduction means utilizing an endless annular wave guide tube provided around said plasma generation chamber and provided with plural slots; a processing chamber connected to said plasma generation chamber; support means for a substrate to be processed; provided in said processing chamber; gas introduction means for said plasma generation chamber and said processing chamber; and evacuation means for said plasma generation chamber and said processing chamber; adapted to effect a plasma process on said substrate by selecting a circumferential length $L_g$ of said endless annular wave guide tube, a wavelength $\lambda_g$ of the microwave in said endless annular wave guide tube, a circumferential length $L_s$ of said dielectric member and a wavelength $\lambda_s$ of the surface wave propagating in said dielectric member so as to substantially satisfy a relationship:

$$L_s/\lambda_s = (2n+1)L_g/\lambda_g$$

wherein n is 0 or a natural number.

27. A microwave processing method according to claim 26, wherein the plasma process is effected under application of a magnetic field.

28. A microwave processing method according to claim 27, wherein said magnetic field is so controlled that the magnetic field in a vicinity of the slots is at a magnetic flux density approximately equal to $3.57 \times 10^{-11}$ (T/Hz) times of a frequency of the microwave.

29. A microwave processing method according to claim 26, comprising a step of placing said substrate on said substrate support means at a position distant from a generation area of said plasma.

30. A microwave processing method according to claim 26, wherein the plasma process is effected under irradiation of the processed substrate with optical energy.

31. A microwave processing method according to claim 30, wherein said optical energy includes ultraviolet light.

32. A microwave processing method according to claim 26, wherein the plasma process is effected by supplying high frequency to said support means.

33. A microwave processing method according to claim 26, wherein a interior of said wave guide tube is filled with a first dielectric material.

34. A microwave processing method according to claim 26, wherein an interior of said wave guide tube is filled with a second dielectric material which is different from said first dielectric material.

35. A microwave processing method according to claim 26, wherein said plasma process is film forming.

36. A microwave processing method according to claim 26, wherein said plasma process is etching.

37. A microwave processing method according to claim 26, wherein said plasma process is ashing.

38. A microwave plasma processing method utilizing a microwave plasma processing apparatus comprising a plasma generation chamber of which periphery is separated from ambient air by a dielectric member; microwave introduction means utilizing a cylindrical endless annular wave guide tube provided around said plasma generation chamber and provided with plural slots; a processing chamber connected to said plasma generation chamber; support means for a substrate to be processed; provided in the processing chamber; gas introduction means for said plasma generation chamber and said processing chamber, and evacuation means for said plasma generation chamber and said processing chamber, adapted for effecting a plasma process by selecting a central radius $R_g$ of said endless annular wave guide tube, a wavelength $\lambda_g$ of the microwave in said endless annular wave guide tube, a central radius $R_s$ of said dielectric member and a wavelength $\lambda_s$ of the surface wave propagating in said dielectric member so as to substantially satisfy a relationship:

$$R_s/\lambda_s = (2n+1)R_g/\lambda_g$$

wherein n is 0 or a natural number.

39. A microwave processing method according to claim 38, wherein the plasma process is effected under application of a magnetic field.

40. A microwave processing method according to claim 39, wherein said magnetic field is so controlled that the magnetic field in a vicinity of the slots is at a magnetic flux density approximately equal to $3.57 \times 10^{-11}$ (T/Hz) times of a frequency of the microwave.

41. A microwave processing method according to claim 38, comprising a step of placing said substrate on said substrate support means at a position distant from a generation area of said plasma.

42. A microwave processing method according to claim 38, wherein the plasma process is effected under irradiation of the processed substrate with optical energy.

43. A microwave processing method according to claim 42, wherein said optical energy includes ultraviolet light.

44. A microwave processing method according to claim 38, wherein the plasma process is effected by supplying high frequency to said support means.

45. A microwave processing method according to claim 38, wherein an interior of said wave guide tube is filled with a first material.

46. A microwave processing method according to claim 38, wherein an interior of said wave guide tube is filled with a second dielectric material which is different from said first dielectric material.

47. A microwave processing method according to claim 38, wherein said plasma process is film forming.

48. A microwave processing method according to claim 38, wherein said plasma process is etching.

49. A microwave processing method according to claim 38, wherein said plasma process is ashing.

50. A microwave plasma processing method wherein a substrate is placed in a microwave plasma processing apparatus comprising a plasma generation chamber separated from ambient air by a first dielectric material; a processing chamber connected to the plasma generation chamber; means for supporting a substrate to be processed, to be placed in the processing chamber; microwave introduction means utilizing an endless annular wave guide tube provided around said plasma generation chamber and provided with plural slots; means for introducing gas for said plasma generation chamber and said processing chamber; and evacuation means for said plasma generation chamber and said processing chamber, wherein the interior of said annular wave guide tube is filled with a second dielectric material which is the same as or different from the first dielectric material, thereby effecting a plasma process.

51. A microwave processing method according to claim 50, wherein a ratio of the dielectric constants of said first and second dielectric materials is approximately equal to a reciprocal of a square of a ratio of circumferential lengths of said first and second dielectric materials.

52. A microwave processing method according to claim 50, wherein said plasma process is effected under application of a magnetic field.

53. A microwave processing method according to claim 52, wherein the magnetic field in a vicinity of the slots has a magnetic flux density approximately equal to $3.57 \times 10^{-11}$ (T/Hz) times of a frequency of the microwave.

54. A microwave processing method according to claim 50, comprising a step of placing said substrate on said substrate support means at a position distant from a generation area of said plasma.

55. A microwave processing method according to claim 50, wherein the plasma process is effected under irradiation of the substrate with optical energy.

56. A microwave processing method according to claim 50, wherein the plasma process is effected by supplying high frequency to said support means.

57. A microwave processing method according to claim 50, wherein said plasma process is film forming.

58. A microwave processing method according to claim 50, wherein said plasma process is etching.

59. A microwave processing method according to claim 50, wherein said plasma process is ashing.

* * * * *

UNITED STATES PATENT AND TRADEMARK OFFICE
CERTIFICATE OF CORRECTION

PATENT NO. : 5,803,975
DATED : September 8, 1998
INVENTOR(S) : NOBUMASA SUZUKI

Page 1 of 4

It is certified that error appears in the above-identified patent and that said Letters Patent is hereby corrected as shown below:

ON TITLE PAGE AT [57] ABSTRACT

Line 21, "$L_s/\lambda_s=(2n1)L_g/\lambda_g$" should read --$L_s/\lambda_s=(2n+1)L_g/\lambda_g$--.

COLUMN 1

Line 28, "microwave a" should read --a microwave--.

COLUMN 3

Line 16, "thus" should read --the thus--.

COLUMN 4

Line 10, "of which" should read --whose--;
Line 48, "of which" should read --whose--.

COLUMN 5

Line 4, "of" should be deleted.

COLUMN 6

Line 55, "in" should read --in the--.

COLUMN 7

Line 20, "In case" should read --When--.

UNITED STATES PATENT AND TRADEMARK OFFICE
CERTIFICATE OF CORRECTION

PATENT NO. : 5,803,975
DATED : September 8, 1998
INVENTOR(S) : NOBUMASA SUZUKI

It is certified that error appears in the above-identified patent and that said Letters Patent is hereby corrected as shown below:

COLUMN 8

Line 62, "case" should read --the case--.

COLUMN 9

Line 23, "of" should be deleted;
   Line 38, "gas)" should read --gas) can be an --.

COLUMN 12

Line 67, "304, according to the purpose." should read --304.--

COLUMN 13

Line 6, "$Ar^{30}$" should read --$Ar^+$--.

COLUMN 14

Line 47, "105, according to the purpose." should read --105.--.

COLUMN 15

Line 55, "interior" should read --interiors--.

COLUMN 16

Line 20, "$Ar^{30}$" should read --$Ar^+$--.

UNITED STATES PATENT AND TRADEMARK OFFICE
CERTIFICATE OF CORRECTION

PATENT NO. : 5,803,975

DATED : September 8, 1998

INVENTOR(S) : NOBUMASA SUZUKI

Page 3 of 4

It is certified that error appears in the above-identified patent and that said Letters Patent is hereby corrected as shown below:

COLUMN 26

Line 56, "of which" should read --whose--.

COLUMN 27

Line 32, "first" should be deleted;
   Line 35, "second" and "first" should be deleted;
   Line 36, "material" should read --member--;
   Line 39, "of which" should read --whose--;
   Line 41, "a" should read --an--.

COLUMN 28

Line 17, "first" should be deleted;
   Line 20, "second" and "first" should be deleted;
   Line 21, "material" should read --member--;
   Line 44, "a" shuld be deleted;
   Line 63, "of which" should read --whose--.

COLUMN 29

Line 2, "processed;" should read --processed,--;
   Line 37, "a" should read --an--;
   Line 38, "first" should be deleted;
   Line 41, "second" and "first" should be deleted;
   Line 42, "material" should read --member--;
   Line 51, "of which" should read --whose--;
   Line 57, "processed;" should read --processed,--;
   Line 59, "chamber," should read --chamber;--.

UNITED STATES PATENT AND TRADEMARK OFFICE
CERTIFICATE OF CORRECTION

PATENT NO. : 5,803,975

DATED : September 8, 1998

INVENTOR(S) : NOBUMASA SUZUKI

It is certified that error appears in the above-identified patent and that said Letters Patent is hereby corrected as shown below:

COLUMN 30

Line 25, "first" should read --dielectric--;
   Line 28, "second" and "first" should be deleted;
   Line 29, "material" should read --member--.

COLUMN 31

Line 3, "substrate" should read --processed substrate---.

Signed and Sealed this

Thirteenth Day of February, 2001

Attest:

NICHOLAS P. GODICI

Attesting Officer

Acting Director of the United States Patent and Trademark Office